US009560730B2

(12) United States Patent
De Dea et al.

(10) Patent No.: US 9,560,730 B2
(45) Date of Patent: Jan. 31, 2017

(54) TRANSPORT SYSTEM FOR AN EXTREME ULTRAVIOLET LIGHT SOURCE

(71) Applicant: ASML Netherlands B.V., Veldhoven (NL)

(72) Inventors: Silvia De Dea, San Diego, CA (US); Alexander I. Ershov, Escondido, CA (US); Brandon Verhoff, San Diego, CA (US); Gregory Wilson, San Diego, CA (US); Bruno M. La Fontaine, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 42 days.

(21) Appl. No.: 14/022,026

(22) Filed: Sep. 9, 2013

(65) Prior Publication Data

US 2015/0069273 A1 Mar. 12, 2015

(51) Int. Cl.
*H05G 2/00* (2006.01)
*G03F 7/20* (2006.01)

(52) U.S. Cl.
CPC .......... *H05G 2/008* (2013.01); *G03F 7/70033* (2013.01); *G03F 7/70925* (2013.01); *H05G 2/005* (2013.01)

(58) Field of Classification Search
CPC .......... H05G 2/00; H05G 2/001; H05G 2/003; H05G 2/005; H05G 2/006; H05G 2/008; G03F 7/70025; G03F 7/70033; G03F 7/70925
USPC ..................... 250/493.1, 503.1, 504 R, 504 H
See application file for complete search history.

(56) References Cited

U.S. PATENT DOCUMENTS

| 3,476,907 | A | 11/1969 | Foex | |
|---|---|---|---|---|
| 4,687,544 | A * | 8/1987 | Bersin | H01J 37/32339 156/345.35 |
| 7,491,954 | B2 | 2/2009 | Bykanov | |
| 8,624,208 | B2 | 1/2014 | Nagai | |
| 8,872,142 | B2 | 10/2014 | Nagai | |
| 2003/0010355 | A1* | 1/2003 | Nowak | B08B 7/00 134/1.1 |
| 2003/0223546 | A1 | 12/2003 | McGregor | |

(Continued)

OTHER PUBLICATIONS

International Search Report for counterpart International Application No. PCT/US2014/052177, mailed Dec. 17, 2014, 3 pages.

(Continued)

*Primary Examiner* — David E Smith
(74) *Attorney, Agent, or Firm* — DiBerardino McGovern IP Group LLC

(57) ABSTRACT

Free radicals that combine with debris that is created by converting a target mixture to plasma that emits EUV light are received at a first opening defined by a first end of a conduit, the conduit including a material that passes the free radicals and the conduit including a sidewall that extends away from the first opening and defines at least one other opening, the at least one other positioned to release the free radicals toward an element that accumulates the debris on a surface. The free radicals in the conduit are directed toward the at least one other opening. The free radicals are passed through the at least one other opening and to the surface of the element to remove the debris from the surface of the element without removing the element from the EUV light source.

44 Claims, 16 Drawing Sheets

(56) References Cited

U.S. PATENT DOCUMENTS

| | | | |
|---|---|---|---|
| 2004/0165160 A1* | 8/2004 | Van Beek | G03F 7/70925 355/30 |
| 2006/0097203 A1 | 5/2006 | Bykanov et al. | |
| 2007/0125964 A1* | 6/2007 | Van Herpen | B82Y 10/00 250/492.2 |
| 2009/0057567 A1* | 3/2009 | Bykanov | G03F 7/70033 250/429 |
| 2010/0051827 A1* | 3/2010 | Derra | B82Y 10/00 250/492.1 |
| 2011/0188011 A1* | 8/2011 | Ehm | B82Y 10/00 355/30 |
| 2011/0226745 A1* | 9/2011 | Nagai | G03F 7/70033 219/121.62 |
| 2012/0212136 A1 | 8/2012 | Einav | |
| 2012/0223256 A1 | 9/2012 | Bykanov | |
| 2012/0223257 A1 | 9/2012 | Nagai et al. | |
| 2012/0313016 A1 | 12/2012 | Fleurov | |
| 2013/0026393 A1* | 1/2013 | Abe | H05G 2/005 250/504 R |
| 2013/0068161 A1* | 3/2013 | White | C23C 16/45578 118/723 R |
| 2013/0126761 A1* | 5/2013 | Nagai | H05G 2/005 250/504 R |
| 2013/0319466 A1* | 12/2013 | Mizoguchi | G03F 7/70925 134/18 |
| 2014/0306115 A1* | 10/2014 | Kuritsyn | G02B 27/0006 250/358.1 |
| 2015/0008345 A1 | 1/2015 | Nagai et al. | |

OTHER PUBLICATIONS

Written Opinion for counterpart International Application No. PCT/US2014/052177, mailed Dec. 17, 2014, 6 pages.

R.K. Grubbs et al., "Attenuation of hydrogen radicals traveling under flowing gas conditions through tubes of different materials," J. Vac. Sci. Technol. A 24(3), May/Jun. 2006, pp. 486-496.

Non-Final Office Action, U.S. Appl. No. 14/740,916, mailed May 6, 2016, 36 pages.

* cited by examiner

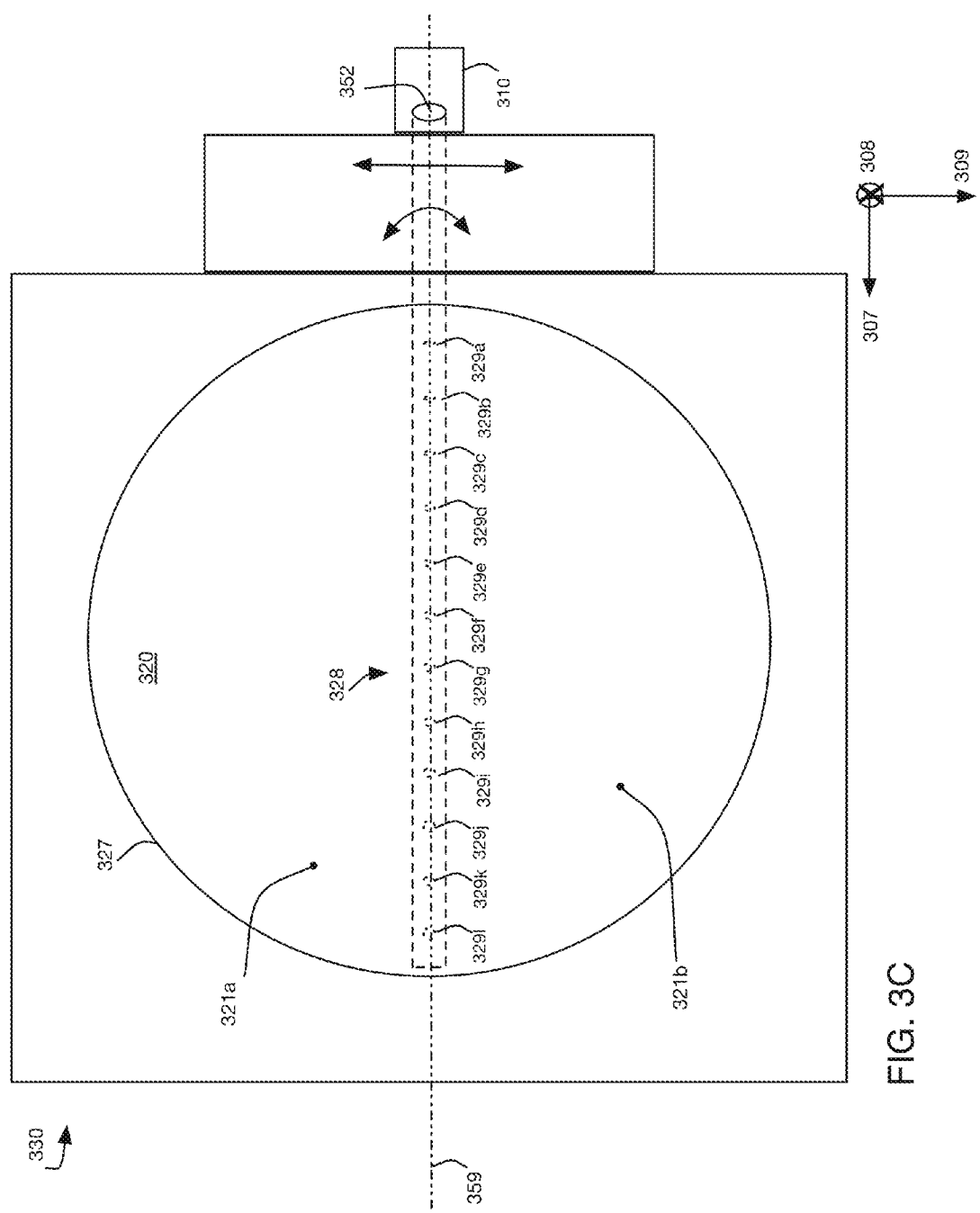

TRANSPORT SYSTEM FOR AN EXTREME ULTRAVIOLET LIGHT SOURCE

TECHNICAL FIELD

The disclosed subject matter relates to a transport system for an extreme ultraviolet light source.

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In one general aspect, a method of cleaning an element in an extreme ultraviolet (EUV) light source includes receiving, at a first opening defined by a first end of a conduit, free radicals that combine with debris that is created by converting a target mixture to plasma that emits EUV light, the conduit including a material that passes the free radicals and the conduit including a sidewall that extends away from the first opening and defines at least one other opening, the at least one other opening passing through the sidewall and positioned to release the free radicals toward an element that accumulates the debris on a surface; directing the free radicals in the conduit toward the at least one other opening; and passing the free radicals through the at least one other opening and to the surface of the element to remove the debris from the surface of the element without removing the element from the EUV light source.

Implementations can include one or more of the following features. The free radicals can remove the debris from the surface of the element by etching.

The at least one other opening defined by the sidewall can be a plurality of openings of different sizes, each passing through the sidewall, and passing the free radicals through the at least one other opening can include passing the free radicals through the plurality of openings. The smallest of the plurality of openings passing through the sidewall can be the opening that is closest to the first opening, and the largest of the plurality of the openings passing through the sidewall can be the opening that is farthest from the first opening. The sizes of the plurality of openings can increase between the smallest of the plurality of openings and the largest of the plurality of openings.

The debris can be removed from the surface of the element at a uniform rate.

The at least one other opening defined by the conduit can be positioned relative to the element. Positioning the at least one other opening defined by the conduit relative to the element can include moving the at least one other opening relative to the element. The at least one other opening can be moved in a plane that is parallel to a perimeter of the element. The at least one other opening can be rotated relative to a plane that includes a perimeter of the element.

The free radicals in the conduit can be directed toward the at least one other opening by creating a pressure differential between a source of the free radicals and the at least one other opening, with the at least one other opening being at a lower pressure than the source of the free radicals and at a higher pressure than a region outside of the conduit.

In another general aspect, a system includes an extreme ultraviolet light source that includes a source that produces an amplified light beam; a vacuum chamber; a target material delivery system that directs target material toward a target location in the vacuum chamber, the target location receiving the amplified light beam, and the target material including a material that emits extreme ultraviolet light when converted to plasma; and a collector that receives and reflects the emitted extreme ultraviolet light. The system also includes a radical transport system including a conduit including a material that passes free radicals, the conduit defining a first opening defined by a first end of the conduit and at least one other opening defined by a sidewall of the conduit, the sidewall of the conduit passing through a wall of the vacuum chamber and positioned with the first opening external to the vacuum chamber and the at least one other opening inside the vacuum chamber and oriented toward the collector.

Implementations can include one or more of the following features.

The radical transport system also can include a source of free radicals.

The radical transport system can include a plurality of conduits.

The at least one other opening can include a plurality of openings defined by and passing through the sidewall. The openings are spaced from each other along a path that is parallel to a longitudinal axis defined by the conduit. The openings can have different sizes, the smallest of the plurality of openings can be closest to the first end of the conduit, and the largest of the plurality of openings can be farthest from the first end of the conduit. The conduit can be positioned so that each of the plurality of openings is inside the vacuum chamber and oriented toward the collector.

The conduit can be positioned outside of a path of propagation of the amplified light beam. The conduit can be configured to move relative to the collector.

In another general aspect, a system includes an extreme ultraviolet light source including a source that produces an amplified light beam; a vacuum chamber; a target material delivery system that directs target material toward a target location in the vacuum chamber, the target location receiving the amplified light beam, and the target material including a material that emits extreme ultraviolet light when converted to plasma; and a collector inside the vacuum chamber and in the path of the plasma, the collector receives and reflects the emitted extreme ultraviolet light and debris. The system also includes a radical transport system including a conduit including a material that passes free radicals, the conduit defining a first opening defined by a first end of the conduit and at least one other opening defined by a sidewall of the conduit, the sidewall of the conduit passing through a wall of the vacuum chamber and configured to direct the free radicals to the collector to remove the debris from the collector at a constant rate without removing the collector from the vacuum chamber.

Implementations can have a sidewall of the conduit with a longitudinal extent of at least 0.8 meters.

Implementations of any of the techniques described above may include a transport system for a laser produced plasma EUV light source, an EUV light source, a system for retrofitting an EUV light source, a method, a process, a device, executable instructions stored on a computer readable medium, or an apparatus. The details of one or more implementations are set forth in the accompanying drawings and the description below. Other features will be apparent from the description and drawings, and from the claims.

DRAWING DESCRIPTION

FIG. 3C shows a plan view of the system of FIG. 3A taken along line 3C-3C.

DESCRIPTION

Figure 1A:
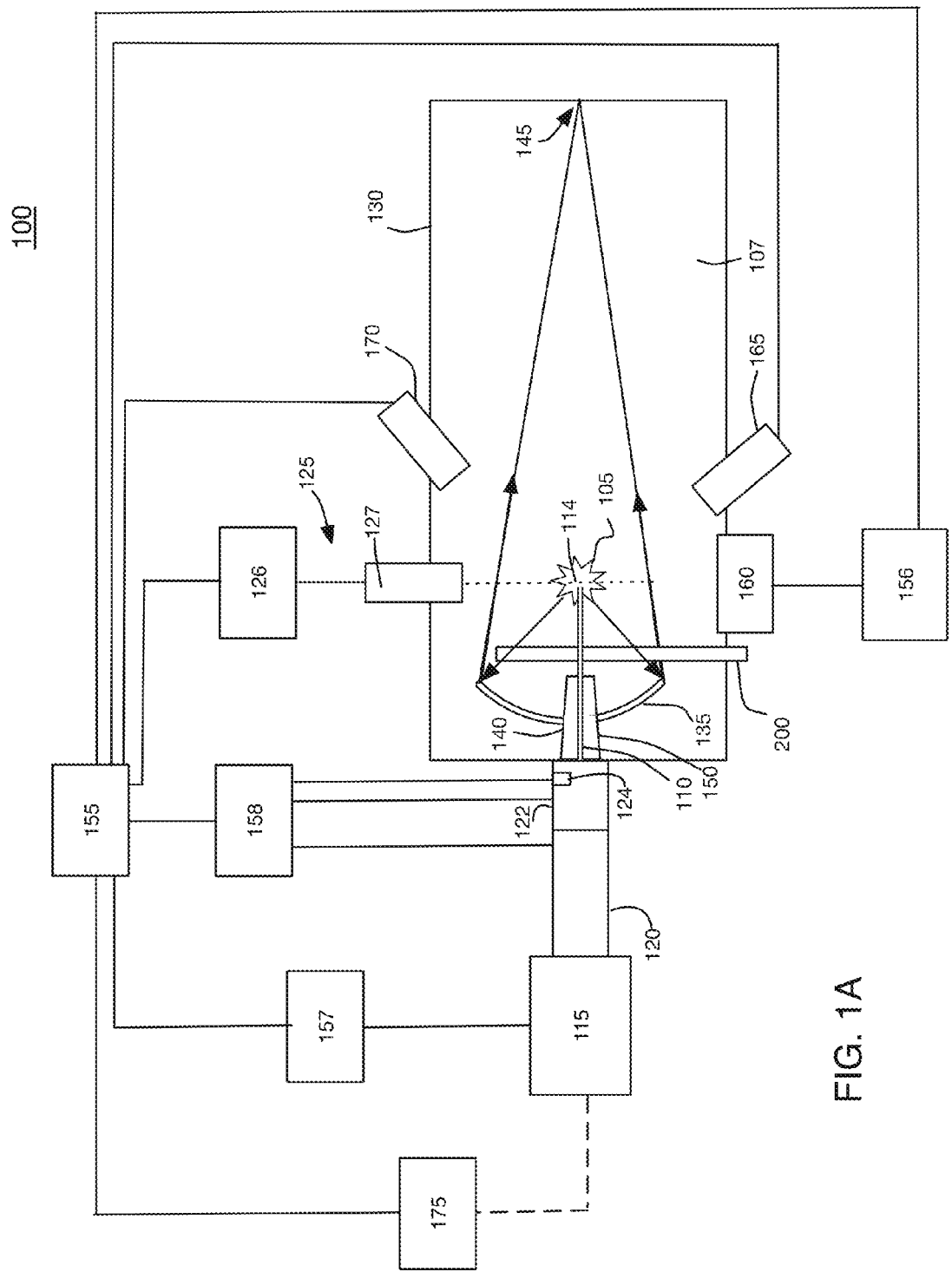
FIG. 1A is a block diagram of an exemplary laser produced plasma extreme ultraviolet light source.

Techniques for delivering free radicals (or radicals) to an element are disclosed. The free radicals combine with debris that collects on a surface of the element, thereby removing the debris from the surface and cleaning the element. The free radicals are delivered to the element with a free radical transport system that allows the element to be cleaned without removing it from its operating environment.

A free radical is an atom, molecule, or ion that has an unpaired valence electron or an open electron shell, and, therefore, may be seen as having a dangling covalent bond. The dangling bonds can make free radicals highly chemically reactive, that is, a free radical can react readily with other substances. Because of their reactive nature, free radicals can be used to remove a substance (such as debris) from an object. The free radicals can remove the debris by, for example, etching, reacting with, and/or combusting the debris.

In a laser produced plasma (LPP) extreme ultraviolet (EUV) light source, a target mixture is irradiated with an amplified light beam and converted to plasma that emits EUV light. The plasma production process can also produce debris in the form of particles, vapor residue, or pieces of matter that is in the target mixture. This debris can accumulate on the surfaces of objects in the path of the plasma. For example, the target mixture can include molten metal, such as tin, and tin particles can accumulate on a collector mirror that is in the path of the plasma.

The presence of the tin debris can reduce the performance of the collector mirror, thus, cleaning the mirror can be beneficial for system performance. However, the collector mirror (and/or other elements in the path of the plasma) is positioned inside of a vacuum chamber in a particular optical alignment. Removing the collector mirror from the EUV light source for cleaning can result in lost system time. The transport system disclosed herein delivers free radicals from the source of the free radicals to an element that is inside of the vacuum chamber. By delivering free radicals to the collector mirror, or other elements in the EUV light source that are affected by debris, the elements can be cleaned by exposure to free radicals without being removed from the EUV light source.

Free radicals can be produced by, for example, a microwave plasma generator. However, because free radicals can combine readily with many materials, particularly metals, transporting radicals from a point of generation to a location for cleaning that is inside of a larger system (such as an EUV light source), separate from the source of free radicals can be challenging.

As discussed below, by forming a transport system that is made from a material that does not readily combine with free radicals and has a geometry that allows the transport system to span a distance between the source and the element to be cleaned while also encouraging movement of free radicals, free radicals can be delivered from an external source of free radicals to an element to be cleaned without relocating the element to be cleaned to the location of the source of free radicals. That is, the element can be cleaned without being removed from its operating environment.

The EUV light source is discussed before discussing the free radical transport system.

Referring to FIG. 1A, an LPP EUV light source 100 is shown. The LPP EUV light source 100 includes a free radical transport system 200. The transport system 200 is shown as being part of the source 100. However, the transport system 200 can be removed from and reinserted into the source 100. The EUV light source 100 is discussed before discussing the free radical transport system 200. The free radical transport system 200 is discussed in greater detail beginning with FIG. 2A.

The LPP EUV light source 100 is formed by irradiating a target mixture 114 at a target location 105 with an amplified light beam 110 that travels along a beam path toward the target mixture 114. The target location 105, which is also referred to as the irradiation site, is within an interior 107 of a vacuum chamber 130. When the amplified light beam 110 strikes the target mixture 114, a target material within the target mixture 114 is converted into a plasma state that has an element with an emission line in the EUV range. The created plasma has certain characteristics that depend on the composition of the target material within the target mixture 114. These characteristics can include the wavelength of the EUV light produced by the plasma and the type and amount of debris released from the plasma.

The light source 100 also includes a target material delivery system 125 that delivers, controls, and directs the target mixture 114 in the form of liquid droplets, a liquid stream, solid particles or clusters, solid particles contained within liquid droplets or solid particles contained within a liquid stream. The target mixture 114 includes the target material such as, for example, water, tin, lithium, xenon, or any material that, when converted to a plasma state, has an emission line in the EUV range. For example, the element tin can be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 114 can also include impurities such as non-target particles. Thus, in the situation in which there are no impurities, the target mixture 114 is made up of only the target material. The target mixture 114 is delivered by the target material delivery system 125 into the interior 107 of the chamber 130 and to the target location 105.

The light source 100 includes a drive laser system 115 that produces the amplified light beam 110 due to a population inversion within the gain medium or mediums of the laser system 115. The light source 100 includes a beam delivery system between the laser system 115 and the target location 105, the beam delivery system including a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The focus assembly 122 receives the amplified light beam 110 and focuses the beam 110 to the target location 105.

In some implementations, the laser system 115 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified and is also a coherent laser oscillation.

The optical amplifiers in the laser system 115 can include as a gain medium a filling gas that includes $CO_2$ and can amplify light at a wavelength of between about 9100 and about 11000 nm, and in particular, at about 10600 nm, at a gain greater than or equal to 100. Suitable amplifiers and lasers for use in the laser system 115 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The optical amplifiers in the laser system 115 can also include a cooling system such as water that can be used when operating the laser system 115 at higher powers.

Figure 1B:
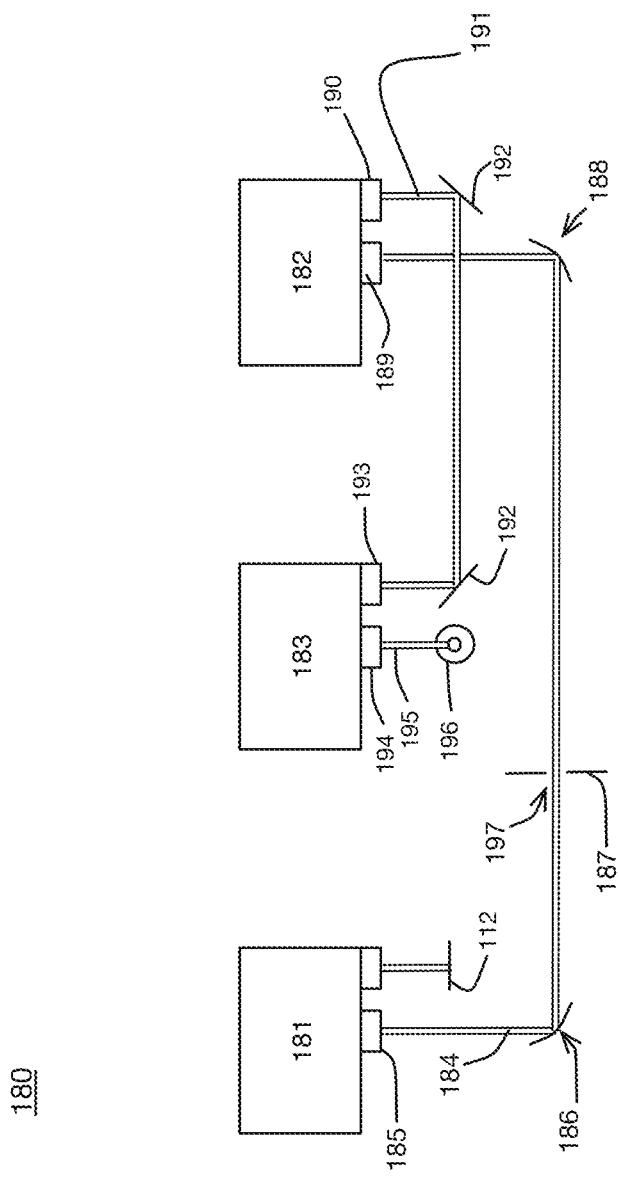
FIG. 1B is a block diagram of an example of a drive laser system that can be used in the light source of FIG. 1A.

FIG. 1B shows a block diagram of an example drive laser system 180. The drive laser system 180 can be used as the drive laser system 115 in the source 100. The drive laser system 180 includes three power amplifiers 181, 182, and 183. Any or all of the power amplifiers 181, 182, and 183 can include internal optical elements (not shown).

Light 184 exits from the power amplifier 181 through an output window 185 and is reflected off a curved mirror 186. After reflection, the light 184 passes through a spatial filter 187, is reflected off of a curved mirror 188, and enters the power amplifier 182 through an input window 189. The light 184 is amplified in the power amplifier 182 and redirected out of the power amplifier 182 through an output window 190 as light 191. The light 191 is directed toward the amplifier 183 with a fold mirror 192 and enters the amplifier 183 through an input window 193. The amplifier 183 amplifies the light 191 and directs the light 191 out of the amplifier 183 through an output window 194 as an output beam 195. A fold mirror 196 directs the output beam 195 upward (out of the page) and toward the beam transport system 120.

The spatial filter 187 defines an aperture 197, which can be, for example, a circle having a diameter between about 2.2 mm and 3 mm. The curved mirrors 186 and 188 can be, for example, off-axis parabola mirrors with focal lengths of about 1.7 m and 2.3 m, respectively. The spatial filter 187 can be positioned such that the aperture 197 coincides with a focal point of the drive laser system 180.

Referring again to FIG. 1A, the light source 100 includes a collector mirror 135 having an aperture 140 to allow the amplified light beam 110 to pass through and reach the target location 105. The collector mirror 135 can be, for example, an ellipsoidal mirror that has a primary focus at the target location 105 and a secondary focus at an intermediate location 145 (also called an intermediate focus) where the EUV light can be output from the light source 100 and can be input to, for example, an integrated circuit lithography tool (not shown). The light source 100 can also include an open-ended, hollow conical shroud 150 (for example, a gas cone) that tapers toward the target location 105 from the collector mirror 135 to reduce the amount of plasma-generated debris that enters the focus assembly 122 and/or the beam transport system 120 while allowing the amplified light beam 110 to reach the target location 105. For this purpose, a gas flow can be provided in the shroud that is directed toward the target location 105.

The light source 100 can also include a master controller 155 that is connected to a droplet position detection feedback system 156, a laser control system 157, and a beam control system 158. The light source 100 can include one or more target or droplet imagers 160 that provide an output indicative of the position of a droplet, for example, relative to the target location 105 and provide this output to the droplet position detection feedback system 156, which can, for example, compute a droplet position and trajectory from which a droplet position error can be computed either on a droplet by droplet basis or on average. The droplet position detection feedback system 156 thus provides the droplet position error as an input to the master controller 155. The master controller 155 can therefore provide a laser position, direction, and timing correction signal, for example, to the laser control system 157 that can be used, for example, to control the laser timing circuit and/or to the beam control system 158 to control an amplified light beam position and shaping of the beam transport system 120 to change the location and/or focal power of the beam focal spot within the chamber 130.

The target material delivery system 125 includes a target material delivery control system 126 that is operable, in response to a signal from the master controller 155, for example, to modify the release point of the droplets as released by a target material supply apparatus 127 to correct for errors in the droplets arriving at the desired target location 105.

Additionally, the light source 100 can include light source detectors 165 and 170 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 165 generates a feedback signal for use by the master controller 155. The feedback signal can be, for example, indicative of the errors in parameters such as the timing and focus of the laser pulses to properly intercept the droplets in the right place and time for effective and efficient EUV light production.

The light source 100 can also include a guide laser 175 that can be used to align various sections of the light source 100 or to assist in steering the amplified light beam 110 to the target location 105. In connection with the guide laser 175, the light source 100 includes a metrology system 124 that is placed within the focus assembly 122 to sample a portion of light from the guide laser 175 and the amplified light beam 110. In other implementations, the metrology system 124 is placed within the beam transport system 120. The metrology system 124 can include an optical element that samples or re-directs a subset of the light, such optical element being made out of any material that can withstand the powers of the guide laser beam and the amplified light beam 110. A beam analysis system is formed from the metrology system 124 and the master controller 155 since the master controller 155 analyzes the sampled light from the guide laser 175 and uses this information to adjust components within the focus assembly 122 through the beam control system 158.

Thus, in summary, the light source 100 produces an amplified light beam 110 that is directed along the beam path to irradiate the target mixture 114 at the target location 105 to convert the target material within the mixture 114 into plasma that emits light in the EUV range. The amplified light beam 110 operates at a particular wavelength (that is also referred to as a source wavelength) that is determined based on the design and properties of the laser system 115. Additionally, the amplified light beam 110 can be a laser beam when the target material provides enough feedback back into the laser system 115 to produce coherent laser light or if the drive laser system 115 includes suitable optical feedback to form a laser cavity.

Figure 2A:
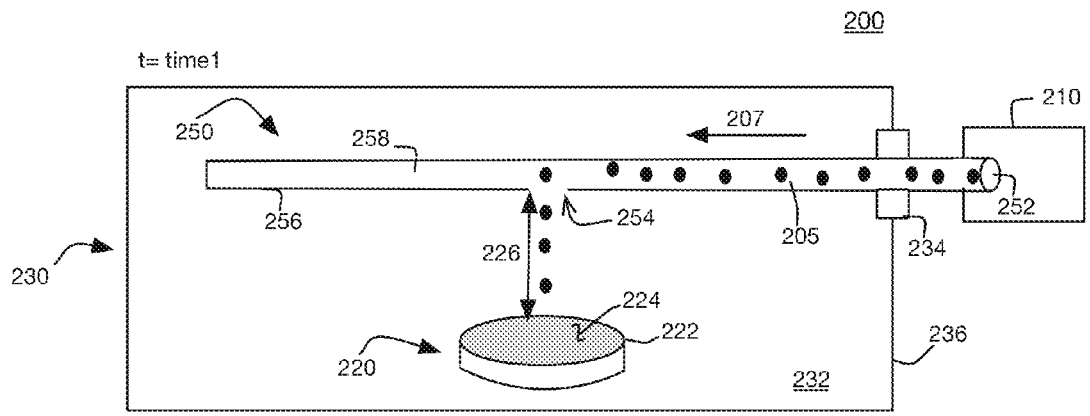
FIG. 2A-2C show a side view of an exemplary free radical transport system at three different times.
Figure 2B:
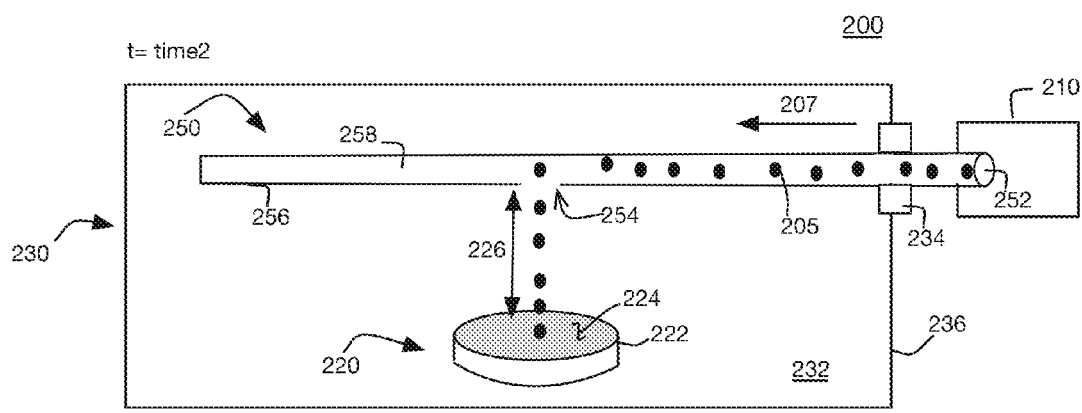
Figure 2C:
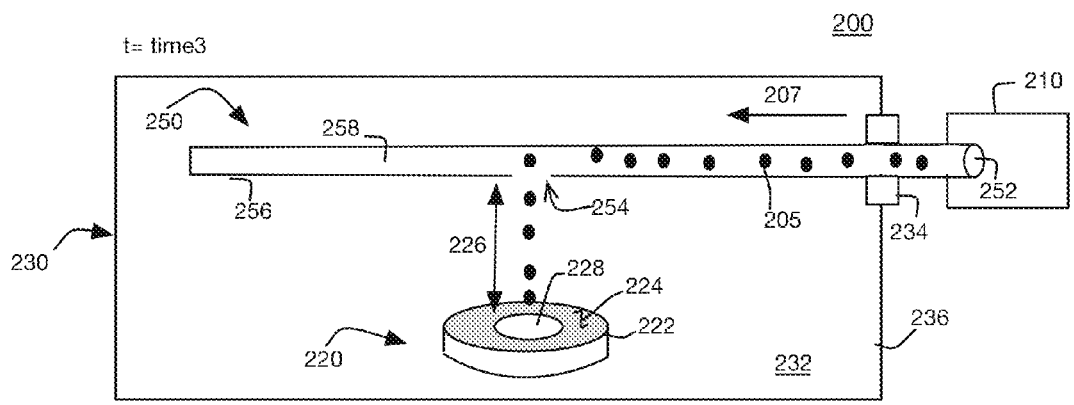

FIGS. 2A-2C show block diagrams of an exemplary free radical transport system 200 at three different times, t1, t2, and t3, respectively. Time t1 is the earliest time, with time t2 occurring after time t1, and time t3 occurring after time t2. The free radical transport system 200 delivers free radicals 205 to an element 220 that is inside of a vessel 230. The free radical transport system 200 is also shown in FIG. 1A.

The free radical transport system 200 includes a conduit 250 that connects to a source 210 of free radicals 205. The free radicals 205 flow into an opening 252 defined by the conduit 250 and travel in the conduit 250 along a direction 207. The conduit 250 also defines another opening 254 that passes through a sidewall 256 of the conduit 250 to provide a passage between an interior 258 of the conduit 250 and the interior 232 of the vessel 230. The vessel 230 can be a vacuum chamber, such as the vacuum chamber 130 discussed above. The element 220 can be any element that is exposed to debris that is generated in the interior 232 of the vessel 230. The element 220 can be an optical element that is in the path of plasma that is generated in the interior 232. For example, the element 220 can be a collector mirror, such as the collector mirror 135 of FIG. 1A.

Referring to FIG. 2A, the free radicals 205 travel from a source 210 through the conduit 250 in the direction 207 and exit through the opening 254 into the interior 232. The opening 254 is positioned so that the radicals 205 flow to the element 220 after exiting through the opening 254. For example, the opening 254 can be positioned to face a surface 222 of the element 220. The opening 254 is positioned a distance 226 from the surface 222. The distance 226 can be, for example, 15 to 30 cm. In the example shown, the conduit 250 includes the one additional opening 254, however, in other implementations, such as those shown in FIGS. 3A-3C and 5-11, a plurality of openings are formed in the conduit.

The element 220 is located in an interior 232 of the vessel 230. The conduit 250 passes through a sealed opening or port 234 in a wall 236 of the vessel 230. Thus, the conduit 250 transports the free radicals 205 from the external source 210 to the element 220. The free radicals 205 exit the conduit 250 through the opening 254 and pass into the interior 232.

Referring to FIG. 2B, the radicals 205 reach debris 224 that is on the surface 222. Continuing the example of the element 220 being in the path of plasma that is generated in the interior 232, the debris 224 can be contamination that originates from vapors, ions, particles, and/or clusters formed from a target mixture used to generate the plasma. The target mixture can be any material that emits EUV light when converted to plasma. Thus, the debris 224 can include vapor residue, particles, ions, or clusters of metal, such as tin, lithium, or any other substance that, when converted to a plasma, emits EUV light. As shown in FIG. 2C, the radicals 205 recombine with the debris 224 to remove the debris 224 from the surface 222. The recombination creates a cleaned region 228 that is free of the debris 224. The cleaned region 228 can be a circular area having a diameter of, for example, 6 inches (15.24 cm) or greater.

The conduit 250 is made of a material that does not react or combine with the free radicals or one that has a low recombination coefficient (for example, a recombination coefficient of about $5 \times 10^{-3}$ or less). The recombination coefficient is a measure of the portion of radicals that recombine on or otherwise attach to material surface. In the context of the free radicals 205 that travel through the conduit 250, the recombination coefficient of the material on an inner wall and the openings 252 and 254 determines, in part, the portion of radicals generated by the source 210 that reach the element 220. Materials that have a lower recombination coefficient allow a larger portion of the generated radicals 205 to reach the element 220 because relatively few of the free radicals 205 generated by the source 310 are lost by recombination through collisions with inner walls of the conduit 250.

The conduit 250 can be made of Teflon, quartz, or glass such as borosilicate glass (for example, Pyrex). In some implementations, the conduit 250 can be made of a metal that is coated, with a material that has a low recombination coefficient, at the portions that could come into contact with a free radical 205. For example, the conduit 250 can be an aluminum conduit having an interior surface and ends that are coated with Pyrex. In another example, the conduit 250 can be made of an oxidized metal, such as silicon dioxide ($SiO_2$), titanium oxide ($TiO_2$), or aluminum oxide ($AlO_2$). As yet another example, the conduit can be made of an anodized metal, such as anodized aluminum. Although a conduit made from a metal oxide can have a higher recombination coefficient than one made from a non-metallic material, a metal conduit can be relatively easier to machine and can be more rugged.

The material of the conduit 250 and the mass flow rate of the radicals 205 through the conduit allow the conduit 250 to be long enough to deliver the radicals 205 to the element 220 in-situ, that is, while the element is inside of the vessel 230. For example, the conduit 250 can have a longitudinal extent along the direction 207 of 0.8-2 meters.

Figure 3A:
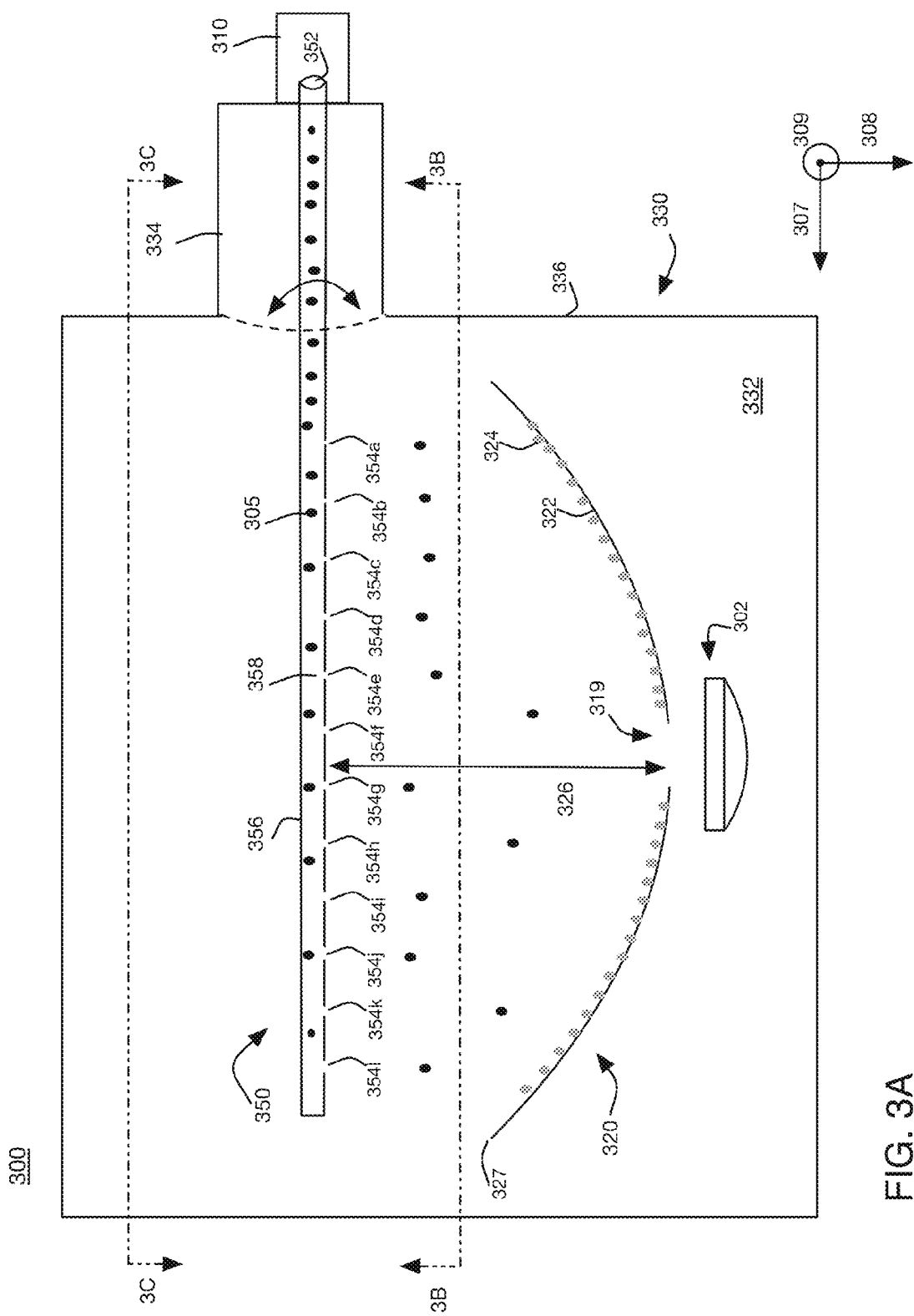
FIG. 3A shows a side view of a block diagram of another exemplary free radical transport system.
Figure 3B:
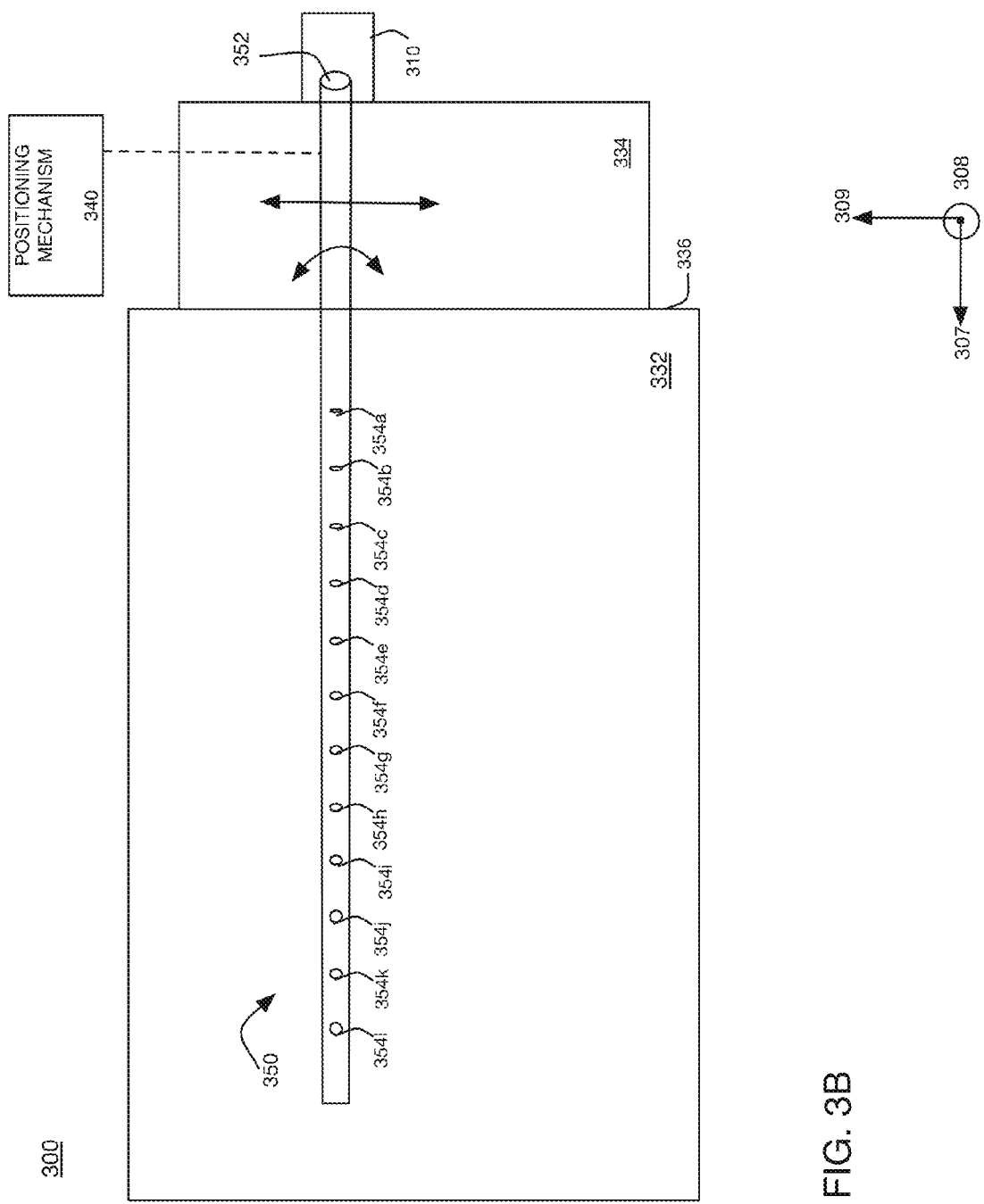
FIG. 3B shows a plan view of the system of FIG. 3A taken along line 3B-3B.

Referring to FIGS. 3A-3C, a block diagram of another exemplary free radical transport system 300 is shown. FIG. 3A shows a side view of the transport system 300, FIG. 3B shows a view of the transport system 300 taken along line 3B-3B of FIG. 3A, and FIG. 3C shows a view of the transport system 300 taken along line 3C-3C of FIG. 3A.

The free radical transport system 300 includes a conduit 350 that defines openings 354a-354l through which free radicals 305 exit the conduit 350 and are directed toward an element 320. The variable size and particular placement of the openings 354a-354l allows the system 300 to provide radicals to the element 320 at a uniform rate, thereby cleaning the element 320 at a uniform rate. The sizes of the openings 354a-354l increase in the direction 307, with the smallest opening (opening 354a) being closest to the source 310 and the largest opening (opening 354l) being farthest from the source 310.

Referring to FIG. 3A, the free radical transport system 300 includes a source 310 that produces the free radicals 305. FIG. 3A shows the conduit 350 from the side, with the openings 354a-354l oriented perpendicular to the direction 307, so that the free radicals 305 flow out of the openings 354a-354l in a direction 308 toward the element 320. The conduit 350 defines an opening 352 that couples to the source 310 and receives the generated free radicals 305. The conduit 350 passes through a sidewall 336 and a sealed port 334 of a vessel 330 (for example, a vacuum chamber) and into an interior 332 of the vessel 330. The free radicals 305 travel in a direction 307 in the conduit 350 and exit through the openings 354a-354l toward the element 320. The conduit 350 is located a distance 326 from the element 320. For an element, such as the element 320 that has a curved surface, that faces the conduit, the distance 326 is the largest distance from the conduit to the element. The distance 326 can be, for example, 15-30 cm.

The element 320 is in the interior 332 a vessel 330. The vessel 330 is part of an LLP EUV light source (such as the light source 100 of FIGS. 1A and 1B). The element 320 defines a surface 322 that is in the path of plasma that is generated in the vessel 330, and the plasma generation can cause debris 324 to form on the surface 322. The debris can include, for example, vapor residue, particles, and ions of a tin droplets that are part of the target mixture used to generate the plasma.

When the radicals 305 reach the debris 324, the radicals 305 combine with the debris 324, thereby removing the debris 324 from the surface 322. Because the conduit 350 delivers the free radicals 305 to the element 320, there is no need to remove the element 320 from the vessel 330 for cleaning. Instead, the element 320 is cleaned while residing inside of the vessel 330. Cleaning the element 320 without removal from the vessel 330 reduces system downtime because, for example, the element 320 is not disturbed and does not have to be realigned after cleaning Referring also to FIGS. 3B and 3C, the conduit 350 includes openings 354a-354l, each of which forms a passage through a wall 356 of the conduit 350. FIG. 3B shows a view of the conduit 350 looking upward at the conduit 350 from the element 320, in a direction that is opposite to the direction 308. FIG. 3C shows a view looking downward onto the element 320, with the direction 308 going into the page. FIG. 3C also shows projections 329a-329l of each of the openings 354a-354l, respectively, on the surface 322 of the element 320. Together, the projections 329a-329l define a swath 328, which is the portion of the element 320 that is exposed to the free radicals 305 emitted from the openings 354a-354l.

The sizes of the openings 354a-354l increase in the direction 307, with the smallest opening (opening 354a) being closest to the source 310 and the largest opening (opening 354l) being farthest from the source 310. As discussed below, the increasing size of the openings 354a-354l in the direction 307 causes the free radicals 305 reach the swath 328 at a uniform rate.

The source 310 can be a microwave plasma generator. To produce free radicals with such a source, a gas from which the free radicals are formed is provided to the source 310. For example, to produce hydrogen radicals, hydrogen gas ($H_2$) is provided. An additional gas can be added to the gas prior to providing the gas to the source 310. For example, a mixture of argon and oxygen ($Ar/O_2$) can be added to the hydrogen gas. Both the hydrogen gas and the additional gas mixture have a mass flow rate and velocity when provided to the source 310. For example, the hydrogen gas can be provided to the source 310 at a mass flow rate of 3 standard liters per minute (SLM), and the $Ar/O_2$ mixture can be provided to the source at a mass flow rate of 21 standard cubic centimeters per minute (SCCM).

The hydrogen and $Ar/O_2$ gasses enter the source 310, are used to produce hydrogen free radicals and a moving gas that passes into the conduit 350 in the direction 307. The moving gas that travels in the conduit gives rise to a back pressure that acts along a direction opposite from the direction 307. The back pressure is a resistance that is encountered by the moving gas as it flows through the conduit 350.

When present, back pressure has the effect of reducing the mass flow rate or velocity of the gas that travels in the conduit 350, which, in turn, causes the free radicals carried by the gas to stay in the conduit 350 for a longer period of time. The time that the free radicals 305 are in the conduit 350 is the "residence time." The presence of back pressure can result in a higher residence time for the hydrogen radicals, and the higher residence time leads to more opportunities for the radicals to recombine with the interior walls of the conduit 350 and fewer hydrogen radicals reaching the element 320.

Increasing the mass flow rate or velocity of the gas flowing in the conduit 350 in the direction 307 can also increase the speed at which the free radicals 305 travel in the conduit 350 quickly, thereby delivering the free radicals to the element 320 at a higher rate and cleaning the element 320 more quickly. However, increasing the mass flow rate or velocity of the flowing gas also can increase the back pressure, which can lower the amount of free radicals delivered to the element 320 (through increased recombination during the radicals' increased residence time in the conduit) and can also lower the speed at which the radicals are delivered to the element 320 (through the reduced velocity of the flowing gas caused by the back pressure). As such, increases in the mass flow rate or velocity of the gas flowing in the conduit 350 are balanced against the creation of back pressure.

Additionally, in a conduit that lacks openings in a sidewall, the pressure or resistance encountered by gas flowing in the conduit can increase in the direction of gas flow. If the openings in the sidewalls are all the same size, more radicals 305 exit from the opening closest to the source than any other opening because the pressure inside the conduit 350 is increased towards the source 310. Further, in this situation, the radicals 305 decrease in velocity as they move through the conduit 350 in the direction 307 because of the reducing or decreasing mass flow in the direction 307. As a result, if all of the openings in the conduit sidewall are the same size, radicals 305 reach the swath 328, but the velocity of the radicals 305 reaching the swath 328 may not be constant throughout the various portions of the swath 328.

In contrast, the openings 354a-354l of the conduit 350 have different sizes, and the sizes of the openings increase in the direction of the gas flow (the direction 307). This arrangement reduces the effect discussed above. Thus, when a conduit that has variable sized openings in a sidewall, such as the conduit 350, is used to deliver the radicals 305 to the surface 322, all of the portions of the swath 328 are cleaned at the same rate.

In some implementations, the backpressure in the conduit is kept below 0.9-1.2 torr, and the centerline velocity of the flowing gas in the direction 307 is between 1-4 SLM. The etch rate or rate of removal of the debris 324 can be, for example, 5-125 nanometers per minute (nm/min). The rate of removal can be greater than 125 nm/min.

The openings 354a-354l can have circular cross sections with diameters of 4.5-6.5 mm and can be spaced equidistant from each other on the conduit 350 in the direction 307. The longitudinal spacing between each of the openings along the direction 307 can be, for example, 40 mm. Although the example shown in FIGS. 3A-3C includes twelve openings, in other examples, more or fewer openings can be used. For example, the conduit 350 can define ten openings or more than twelve openings.

Referring to FIGS. 3B and 3C, to enlarge the area on the element 320 that is cleaned, the conduit 350 can be rotated about a longitudinal axis 359 that extends is defined by the conduit 350 and extends along a direction that is parallel to the direction 307. Alternatively or additionally, the conduit 350 can be translated back and forth along a direction 309. The system 300 includes a positioning mechanism 340 that allows a user of the system 300 to move the conduit 350. The positioning mechanism 340 can be configured for manual operation, for example, with a lever, wheel, or other mechanical device that is accessible from outside of the vessel 330 and allows the user to move the conduit 350. The positioning mechanism 340 can be computer controlled. For example, the conduit 350 can be coupled to a stepper motor or other device that moves the conduit 350 when activated by a user or an automated electronic process.

Translation of the conduit 350 back and forth along the direction 309 moves the conduit 350 relative to the element 320 while keeping the distance 326 (FIG. 3A) constant. In other words, the conduit 350 moves relative to the element 320 in a plane that is parallel to a plane that includes a perimeter or edge 327 of the element 320. Rotating the conduit 350 about the axis 359 allows the free radicals 305 to be delivered to regions of the element 320 that are outside of the swath 328, such as the regions 321a and 321b. Translating the conduit 350 back and forth along the direction 309 also allows free radicals 305 to be delivered to regions of the element 320 that are outside of the swath 328.

Figure 4:
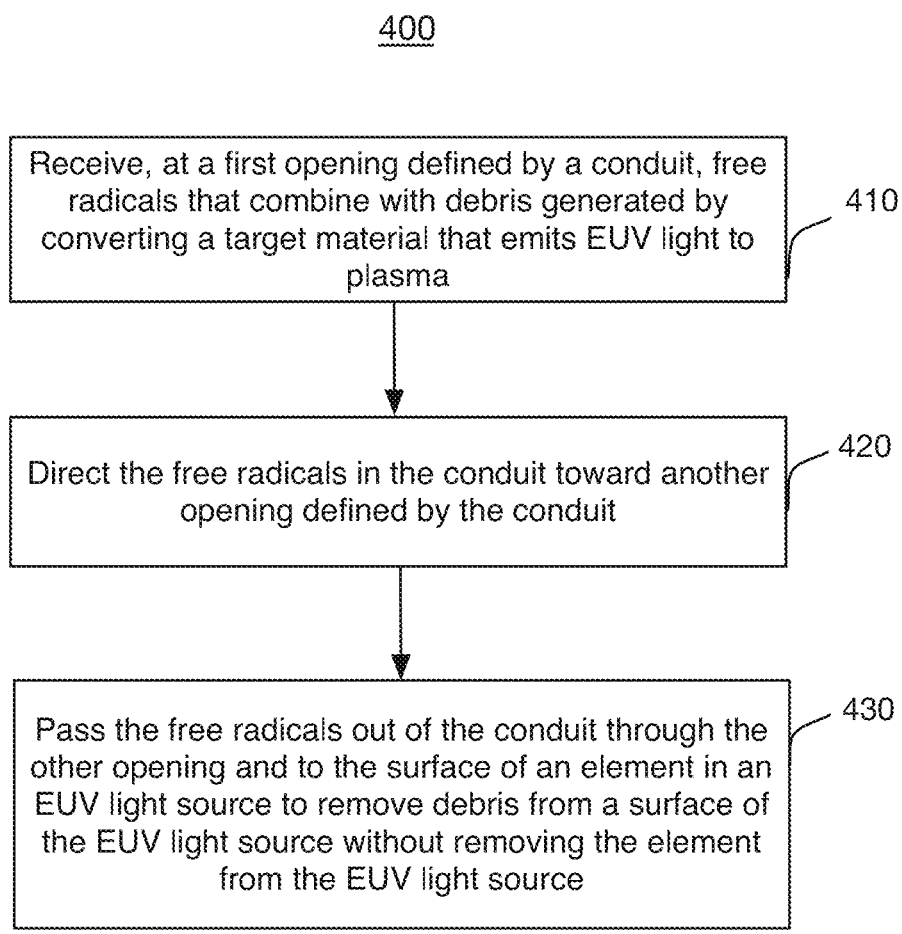
FIG. 4 is a flow chart of an exemplary process for cleaning an element that is inside of a vacuum chamber.

Referring to FIG. 4, a flow chart of an exemplary process 400 for cleaning an optical element in a vacuum chamber of an EUV light source without removing the element from the vacuum chamber is shown. The process 400 can be performed with any free radical transport system disclosed herein. For example, the process 400 can be performed with the transport system 200 or 300. In the discussion of the process 400, the system 300 is used as an example.

Free radicals 305 are received at the first opening 352 defined by the conduit 350 (410). The free radicals combine with debris on an element to be cleaned. The debris can be generated when a target mixture is converted to plasma that emits EUV light, and the debris can accumulate on a surface of the element by virtue of the element being in the path of the plasma. The free radicals 305 are generated by the source 310. The source 310 can be, for example, a microwave plasma generator, such as the SMART POWER GENERATOR available from MKS Instruments, Inc. of Andover, Mass. The source can be operated at, for example, 3000 Watts.

To generate the free radicals, a gas that is capable of being dissociated into free radicals is provided to the source 310. The gas can be or include, for example, hydrogen ($H_2$), hydrogen iodide (HI), bromine ($Br_2$), chlorine ($Cl_2$), iodine, ($I_2$), methane, or water. An additional gas (such as a mixture of argon and oxygen) can be added before providing the mixture to the source 310. The gas is provided to the source 310 at a mass flow rate or velocity, and the free radicals generated at the source 310 flow into the conduit 350 with a gas flow from the source 310.

The opening 352 and the portions of the conduit 350 that transport or are otherwise in the path of the free radicals 305 are made from a material that has a low recombination coefficient. The opening 352 is coupled to an applicator of the microwave plasma generator so that the opening 352 receives the free radicals 305. The applicator of the microwave plasma generator can be made of sapphire, and the conduit 350 and the opening 352 can couple to the sapphire applicator so that the free radicals do not encounter any metal surfaces while flowing from the source 310 into the conduit 350. Such an arrangement can help reduce radical loss at the coupling.

The free radicals 305 in the conduit 350 are directed toward the openings 354a-354l (420). The free radicals 305 can be directed toward the openings 354a-354l by the gas that flows from the source 310 in the conduit 350. Additionally or alternatively, the pressure in the interior 323 of the vessel 330, which is where the openings 354a-354l provide a passage to, is lower than the pressure at the source 310 and in the conduit 350. For example, the pressure in the inside of the vessel 330 can be 300 mtorr (40 pascals). As a result, the free radicals 305 are drawn from the conduit 350, through the openings 354a-354l, and into the interior 332.

As discussed above, to help promote transport of the radicals, the conduit 350 is made from a material that has a low recombination rate with the free radicals that flow into the conduit 350. Additionally, the mass flow rate or velocity of the gas that carries the radicals in the conduit is increased as much as possible while minimizing the effects of back pressure. Increasing the velocity at which the free radicals 305 move in the conduit 350 also reduces the amount of time the free radicals 305 are in the conduit 350, lessening the amount of radical loss that is attributable to collisions with the interior walls of the conduit 350. Increasing the velocity of the free radicals 305 also increases the rate of cleaning of the element. In some implementations, the free radicals 305 travel in the conduit 350 at a constant 1-4 SLM over the longitudinal extent of the conduit 350. The longitudinal extent of the conduit 350 can be, for example, 0.8-2 meters.

The free radicals 305 are passed through at least one of the openings 354a-354l and toward the surface 322 of the element 320 (430). As discussed above a pressure differential between the interior 332 of the vessel 330, the source 310, and the interior of the conduit 350, with the pressure being lowest in the vessel 330, can cause the free radicals 305 to pass through the openings 354a-354l. The openings 354a-354l are oriented towards the swath 328 and direct the free radicals 305 to the swath 328. The radicals 305 combine with debris 324 on the swath 328 and remove the debris 324. The radical can combine with the debris by, for example, etching, combusting, or reacting with the debris 324. The radicals 305 can remove the debris at a rate of 5-125 nm/min.

In some implementations, such as shown in FIGS. 3B and 3C, the openings 354a-354l can be oriented toward the element 320 by rotating and/or translating the conduit 350 so that the openings 354a-354l are pointed toward a particular part of the element 320.

FIGS. 5-8 show other exemplary conduits 550-850, respectively. Any of the conduits can be used in the transport system 200 or 300.

Figure 5:
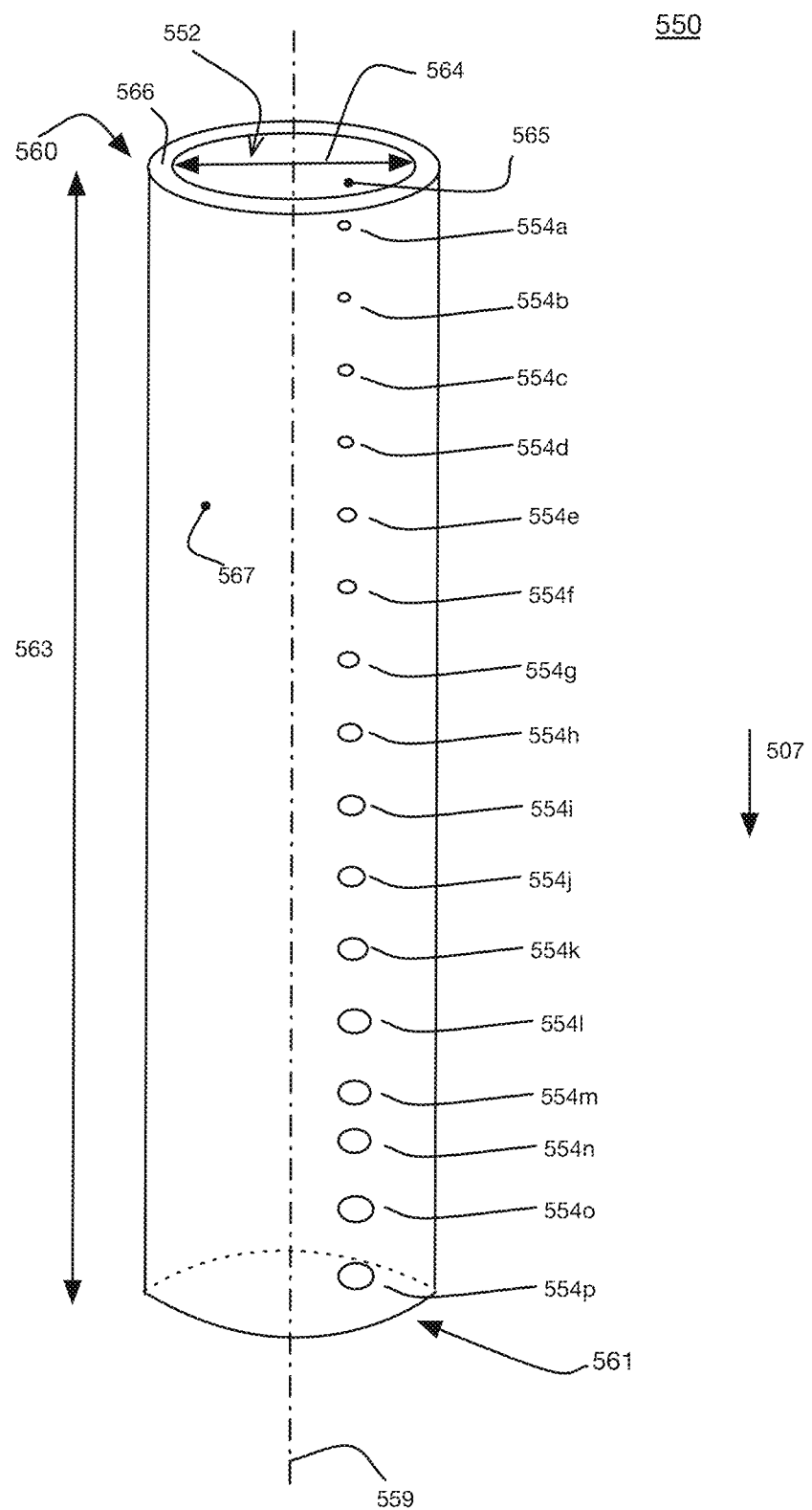
FIGS. 5-7 and 8A show perspective views of exemplary conduits for transporting free radicals.

Referring to FIG. 5, an exemplary conduit 550 is shown. The conduit 550 defines a longitudinal axis 559 and two ends, a source end 560 and a vessel end 561. The conduit 550 has a longitudinal extent 563 that is the distance between the source end 560 and the vessel end 561 in a direction that is parallel to the longitudinal axis 559. The extent 563 can be 0.8-2 m. For example, the extent 563 can be 0.8 m, 0.9 m, 0.95 m, 0.975 m, or 1 m. The conduit 550 has a wall 567 that defines an outer surface 556, an inner surface 565, and a rim 566. The rim 566 of the source end defines an opening 552 that has a diameter of 564. The diameter 564 can be, for example 2.5 cm.

The wall 567 defines openings 554a-554p, each of which pass through the wall 567 to form a passage that allows fluid and free radicals to pass from an interior of the conduit 550 to an exterior of the conduit 550. The size of the openings 554a-554p can vary, with the size increasing along the direction 507. That is, the opening 554a is the smallest opening, and the opening 554p is the largest opening. The openings 554a-554p can be circular in cross section, and can have diameters ranging between 4.5-6.5 mm. The openings can be spaced from each other 20-40 mm in the direction 507. Further, the conduit 550 can have more or fewer openings than the example shown in FIG. 5.

The rim 566 and the inner surface 565 are made from and/or coated with a material that has a low recombination coefficient. The rim 566 and the inner surface 565 can be or be coated with, for example, Pyrex, quartz, glass, a native oxide (such as silicon dioxide or titanium dioxide), or an anodized metal, such as anodized aluminum. The rim 566 and the inner surface 565 can be any material that has a recombination coefficient of about $5 \times 10^{-3}$ or less. In this manner, the rim 566 and the inner surface 565 recombine with relatively few free radicals, instead transporting the free radicals through the conduit and delivering the free radicals to an element to be cleaned. In other cases, material with a recombination coefficient of $1 \times 10^{-2}$ or higher can also be used with a corresponding decrease in the cleaning rate.

In use, the source end 560 is coupled to a source of free radicals and receives free radicals at the opening 552. For example, the source end 560 can be coupled to an applicator of a microwave plasma generator. The applicator of a microwave plasma generator is an element that converts microwave energy to plasma. The applicator of a microwave plasma generator can be a tube that is made of, for example, sapphire. Coupling the sapphire applicator tube to the opening 552 allows the free radicals generated by the source to flow into the conduit 550 without encountering metal or other elements that recombine with the free radicals. As a result, the coupling of the conduit 550 to the source results in the loss of few, if any, free radicals. The free radicals travel into the conduit 550 from the source and exit the conduit through the holes 554a-554p.

Figure 6:
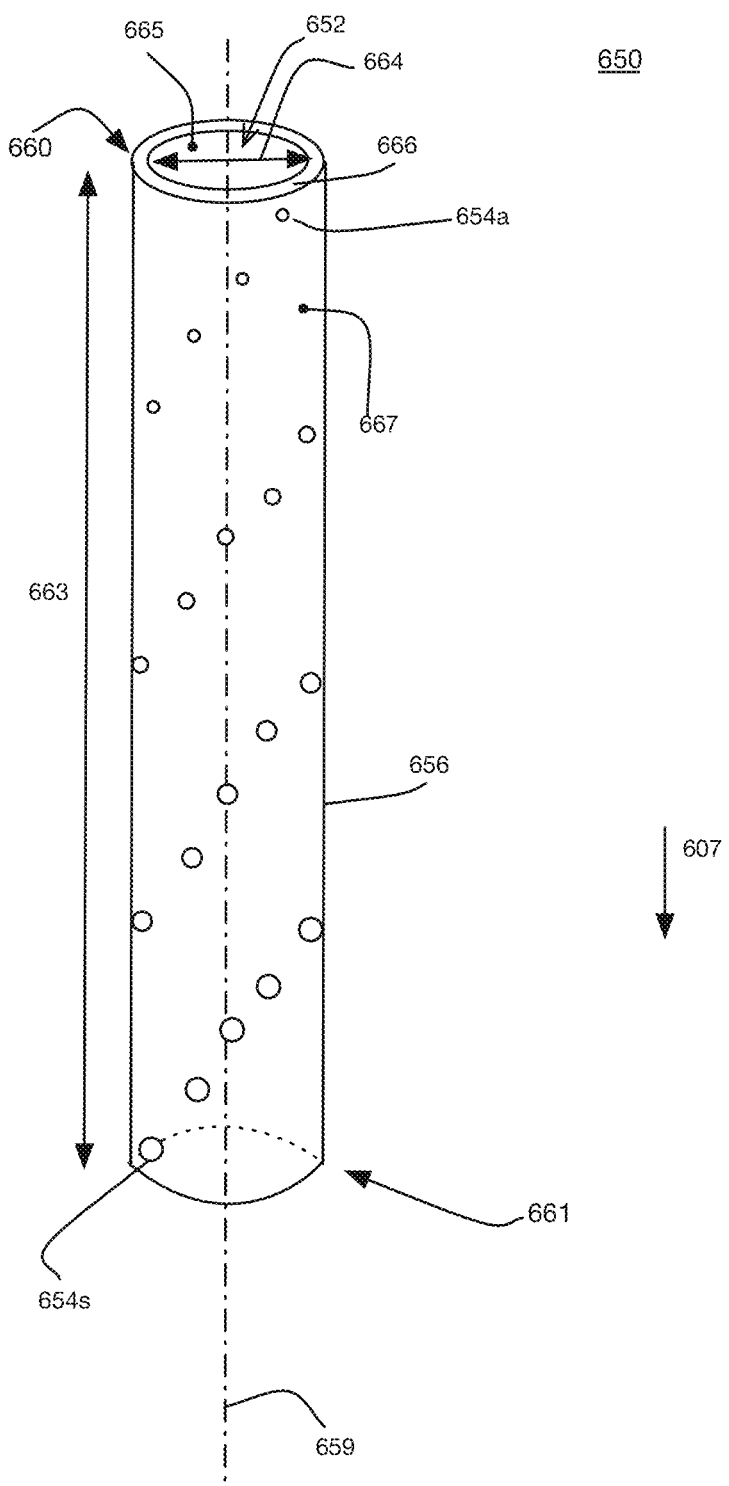
Figure 7:
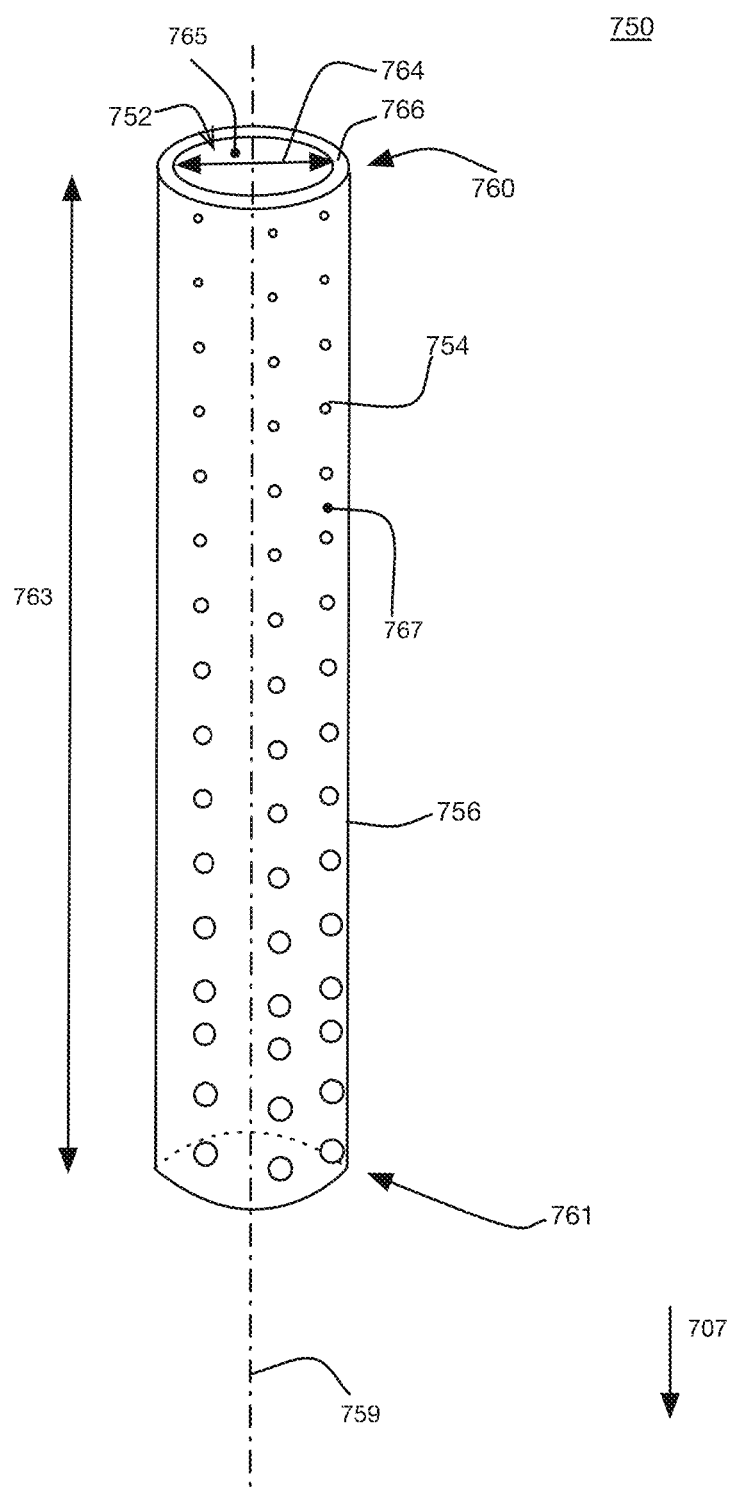

FIGS. 6 and 7 show other exemplary conduits 650 and 750, respectively. The conduits 650 and 750 can be used in any of the transport systems disclosed herein, for example the system 200 or 300 discussed above. The conduits 650 and 750 are similar to the conduit 550, except the conduits 650 and 750 have openings that are offset at different angles by being positioned to pass through different points on a sidewall 667, 767 of the conduit 650, 750. The positioning causes the radicals that are emitted from the conduits 650 and 750 to be emitted over a larger area of the element to be cleaned. In other words, when projected on to the element to be cleaned, the openings of the conduits 650 and 750 cover a larger area than the openings of a conduit that has openings that are all oriented at the same angle relative to the element to be cleaned. An example of such a conduit is one in which all of the openings are aligned along a line that is parallel to a longitudinal axis of the conduit (such as the conduit 550).

Referring to FIG. 6, the conduit 650 has a source end 660 and a vessel end 661. The conduit 650 has a wall 667 that defines a longitudinal axis 659, an outer surface 656, an inner surface 665, and a rim 666. The rim 666 of the source end 660 defines an opening 652 that has a diameter of 664. The diameter 664 can be, for example 2.5 cm. The wall also defines openings 654a-654s. The openings 654a-654s are arranged in a spiral arrangement on the wall 657. The openings 654a-654s can be arranged on only one half of the conduit, as shown in FIG. 6. In other implementations, the openings 654a-654s can be arranged on the surface of the entire conduit 650, so that radicals are emitted from the conduit 650 in all directions.

The conduit 650 has an extent 663 in a direction that is parallel to the longitudinal axis 659. The extent 663 can be 0.8-2 m. For example, the extent 663 can be 0.8 m, 0.9 m, 0.95 m, 0.975 m, or 1 m. Similar to the conduit 550, the inner surface 665 and the rim 666 of the conduit 650 are a material that has a low recombination coefficient.

Referring to FIG. 7, the conduit 750 has a source end 760 and a vessel end 761. The conduit 750 has a wall 767 that defines a longitudinal axis 759, an outer surface 756, an inner surface 765, and a rim 766. The rim 766 of the source end 760 defines an opening 752 that has a diameter of 764. The diameter 764 can be, for example 2.5 cm. The wall also defines a plurality of openings 754, each of which provides a passage between the interior and exterior of the conduit 650 for radicals and gas. The openings 754 are arranged in columns that extend parallel to the longitudinal axis 759. The openings 754 have different sizes, with the sizes increasing in the direction 707. The example conduit 750 shown in FIG. 7 has three columns of openings. However, more or fewer columns of openings can be used.

The conduit 750 has an extent 763 in a direction that is parallel to the longitudinal axis 759. The extent 763 can be 0.8-2 m. For example, the extent 763 can be 0.8 m, 0.9 m, 0.95 m, 0.975 m, or 1 m. Similar to the conduit 550, the inner surface 765 and the rim 766 of the conduit 750 are a material that has a low recombination coefficient.

Figure 8A:
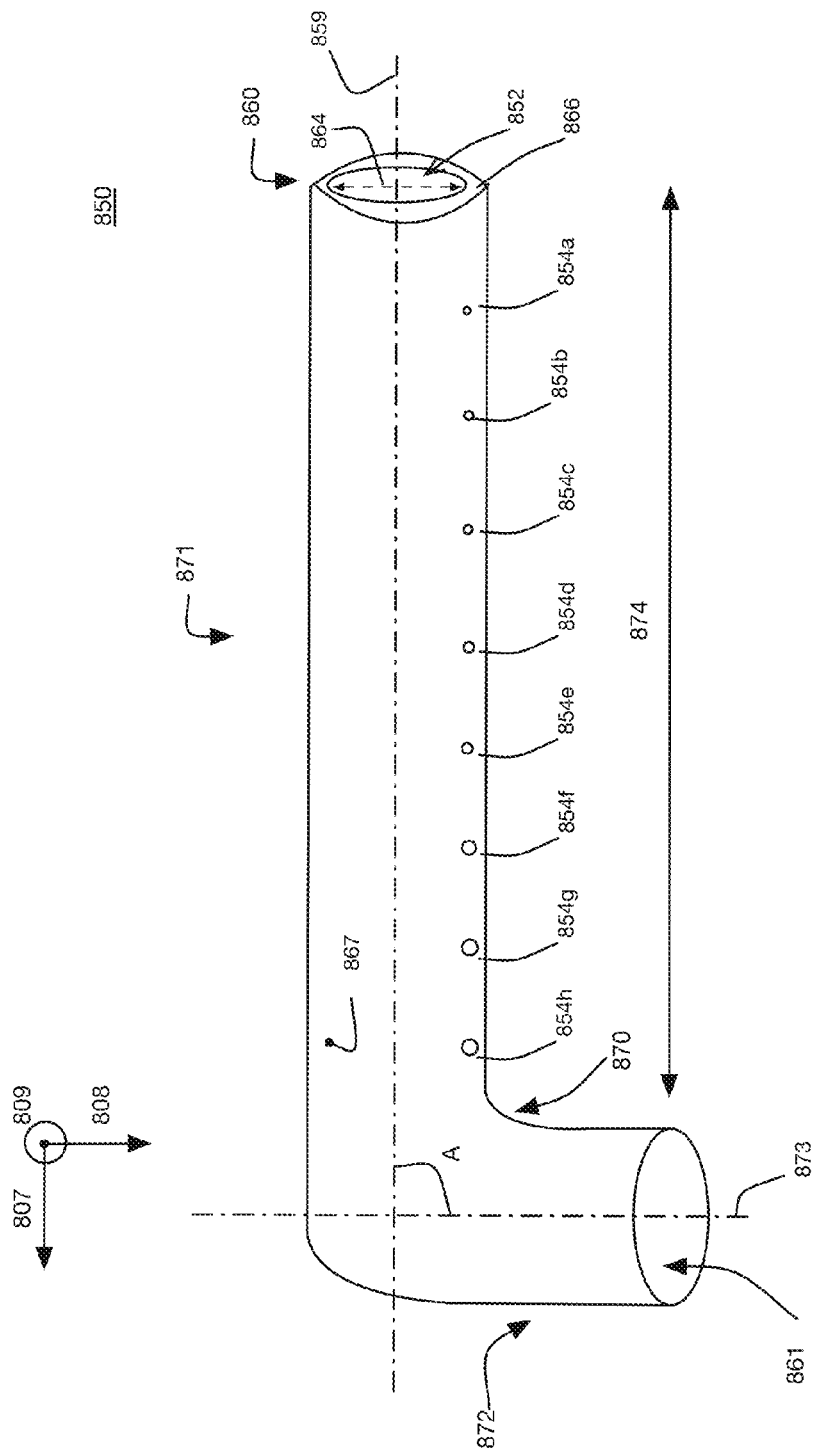
Figure 8B:
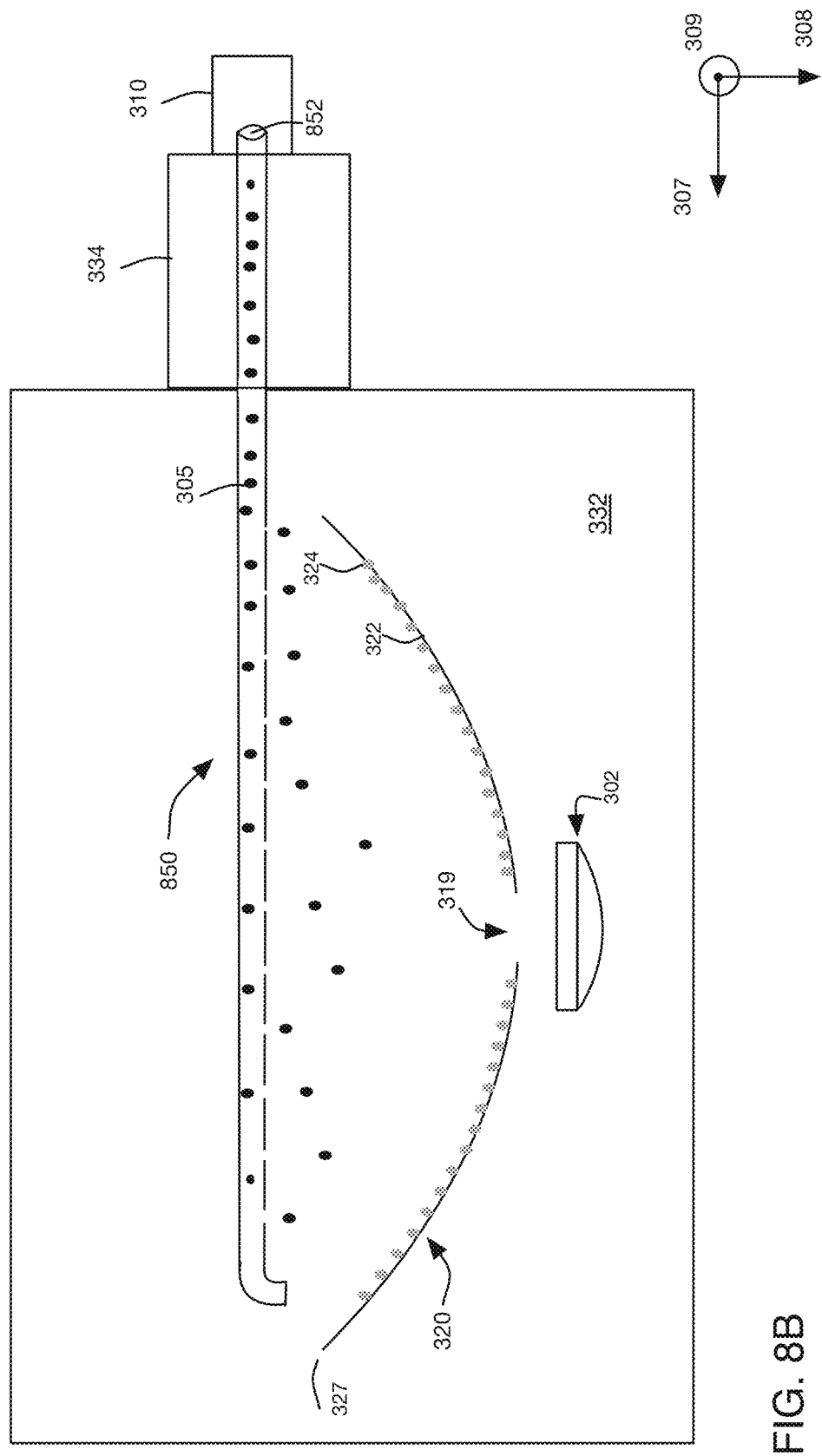
FIG. 8B shows a side view of another exemplary free radical transport system.

Referring to FIG. 8A, another exemplary conduit 850 is shown. The conduit 850 can be used as a conduit in any of the transport systems disclosed herein. For example, and referring also to FIG. 8B, the conduit 850 can be used in place of the conduit 350 in the transport system 300. The conduit 850 is similar to the conduit 550, except that the conduit 850 has a radius of curvature 870. Because of the radius of curvature, the conduit 850 has a linear portion 871 that defines a longitudinal axis 859, and a curved portion 872 that bends away from the linear portion 871 and extends along an axis 873. The radius of curvature 870 can be any curvature such that the angle "A" between the longitudinal axis 859 and the axis 873 is greater than 0° and no more than 90°.

The conduit 850 includes a source end 860 and a vessel end 861. The conduit has an extent 874 along a direction 807 that is parallel to the longitudinal axis 859. The extent 874 can be 0.8 m, 0.9 m, 0.95 m, 0.975 m, or 1 m.

The conduit 850 has a wall 867 that defines a longitudinal axis 859, an outer surface 856, an inner surface 865, and a rim 866. The rim 866 of the source end 860 defines an opening 852 that has a diameter of 864. The diameter 864 can be, for example 2.5 cm. The wall also defines a plurality of openings 854, each of which provides a passage between the interior and exterior of the conduit 850 for radicals and gas. The openings 854 have different sizes, with the sizes increasing in the direction 807.

Similar to the conduit 550, the inner surface 865 and the rim 866 of the conduit 850 are a material that has a low recombination coefficient.

Figure 9A:
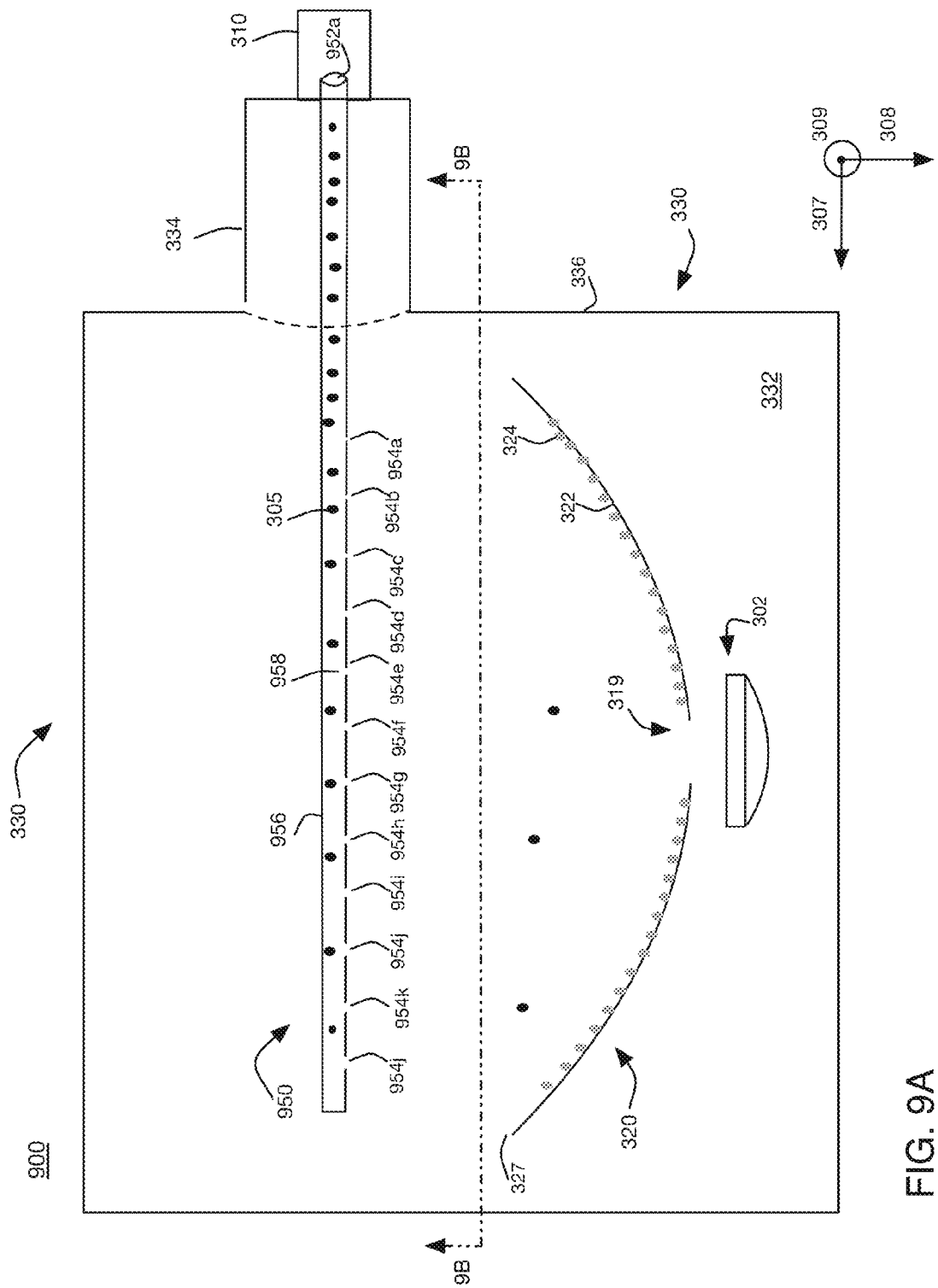
FIG. 9A shows a side view of another exemplary free radical transport system.
Figure 9B:
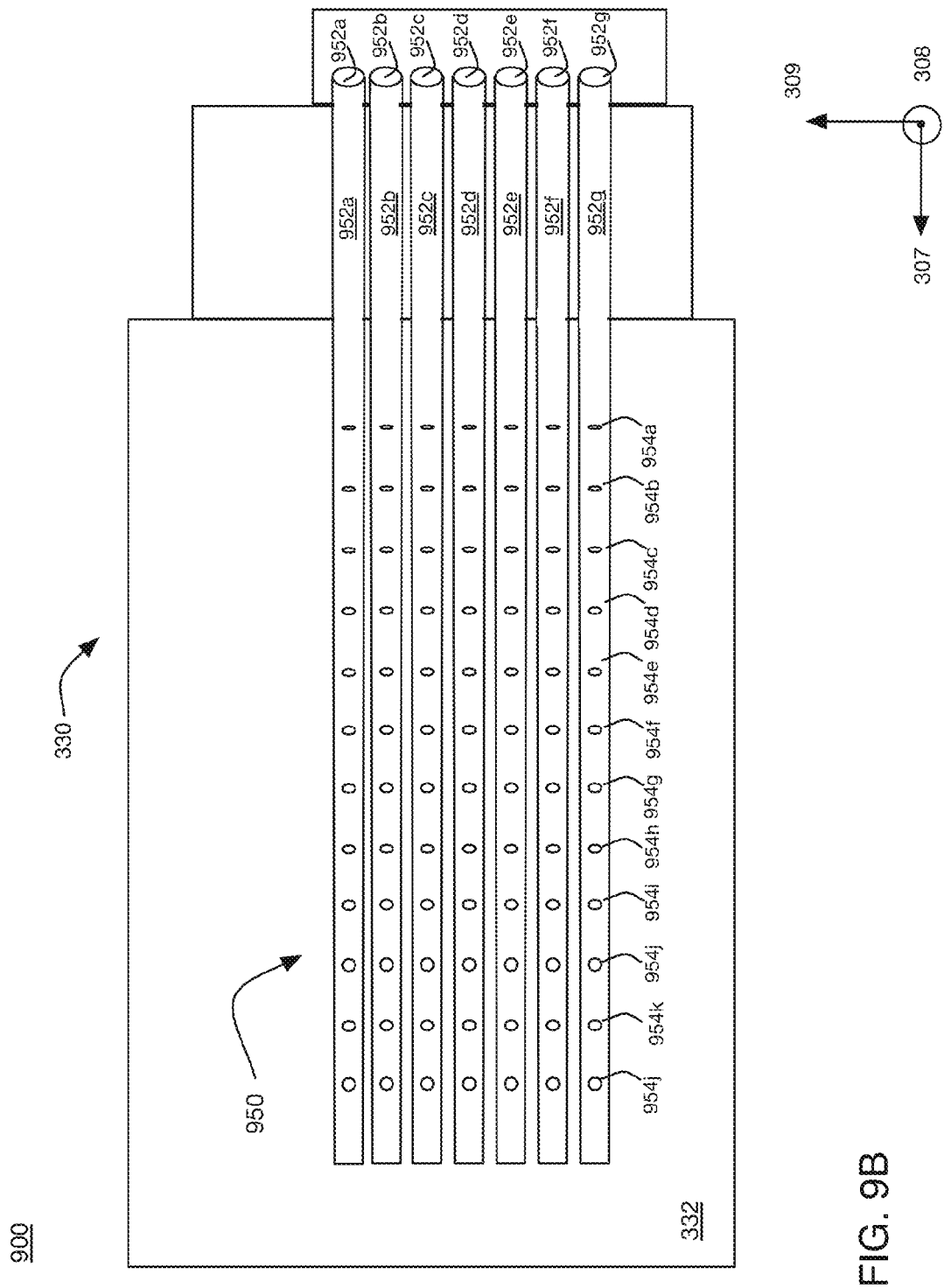
FIG. 9B shows a plan view of the system of FIG. 9A taken along line 9B-9B.

Referring to FIGS. 9A and 9B, a block diagram of another exemplary free radical transport system 900 is shown. FIG. 9A shows a side view of the transport system 900. FIG. 9B shows a cross-sectional view of the transport system 900 taken along the line 9B-9B of FIG. 9A.

The transport system 900 includes a manifold 950 (FIG. 9B) that includes a plurality of conduits 950a-950g. The plurality of conduits 950a-950g is connected to a source of free radicals 905. In some implementations, each conduit 950a-950g is connected to a separate source of free radicals. The source 910 produces free radicals 905 that enter the conduits 950a-950g at openings 952a-952g, respectively, and flow in the conduits 950a-950g in a direction 907.

Each of the conduits 950a-950g has openings 954a-954l, all of which form a passage through a wall of the conduit and release free radicals 905 toward the element 920. Thus, as compared to a transport system that includes a single conduit, the transport system 900 can clean a larger area of an element 920 without having to rotate or translate the manifold 950. However, in some implementations, the manifold 950 can be rotated or translated to further increase the size of the region that is cleaned by the free radicals 905.

Further, in the conduits 950a-950g, the openings 954a-954l are each of a different size, with the sizes increasing in the direction 907. This is similar to the openings 354a-354l of conduit 350 that are discussed above a with respect to FIGS. 3A-3C. As such, the conduits 950a-950g deliver the free radicals 905 to the element 920 at a uniform rate, which results in debris being cleaned from the element 920 at a uniform rate. In other implementations, the openings 954a-954l can all be the same size. Although the manifold 950 includes seven (7) conduits, more or fewer conduits can be used. Additionally, the conduits of the manifold can include more or fewer openings than shown, and the conduits can include different numbers of openings.

Figure 10A:
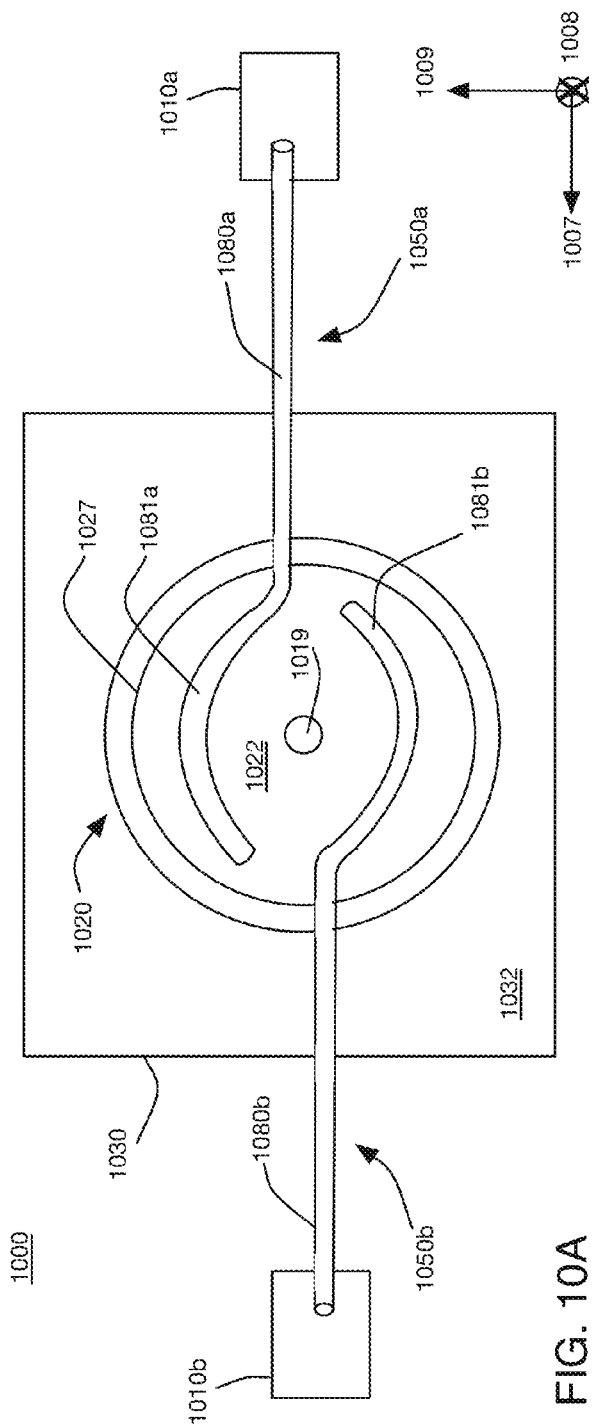
FIG. 10A shows a plan view of another exemplary free radical transport system.

Referring to FIG. 10A, a block diagram of another exemplary free radical transport system 1000 is shown. The view of the transport system 1000 is downward toward an element 1020 to be cleaned. The transport system 1000 is part of an LPP EUV light source, such as the source 100 of FIG. 1A, and the element 1020 is in the interior 1032 of a vessel 1030.

The transport system 1000 includes conduits 1050a, 1050b, each of which connects to a source of free radicals 1010a, 1010b, respectively. Free radicals from the sources 1010a, 1010b flow into the conduits 1050a, 1050b. Similar to the conduit 550 discussed above, the conduits 1050a, 1050b are made from a material that has a low recombination rate.

The element 1020 defines a surface 1022 that accumulates debris 1024 by being in the path of plasma that is generated in the vessel 1030. The plasma can be generated by passing an amplified light beam through an aperture 1019 in the element 1020 to irradiate a target mixture (not shown) and convert the target mixture to plasma. The element 1020 can be, for example, a collector mirror that receives EUV light emitted by the plasma and focuses the light to a location that is out of the page of FIG. 10A. Thus, in FIG. 10A, the optical path of the amplified light beam and the focused EUV light is in a direction that is out of the page (opposite to the direction 308, which is into the page). The optical path of the amplified light beam is out of the page, but also passes through the aperture 1019.

As compared to the transport systems shown in FIGS. 3A-3C, 8B, 9A, and 9B, the conduits 1050a and 1050b of the transport system 1000 are outside of the optical path. Like the transport system 300, the transport system 1000 can be used to clean the element 1020 "in-situ," or while the element 1020 is inside of the vessel 1030. Additionally, because the transport system 1000 is out of the optical path, the transport system 1000 can be used while the light source is in operation.

The conduits 1050a, 1050b have linear portions 1080a, 1080b and curved portions 1081a, 1081b. The curved portions 1081a, 1081b follow an edge 1027 of the element 1020, avoiding the optical path. The conduits 1050a, 1050b are made of a material that has a low recombination coefficient and thus delivers free radicals from the sources 1010a, 1010b to the interior of the vessel 1030.

Figure 10B:
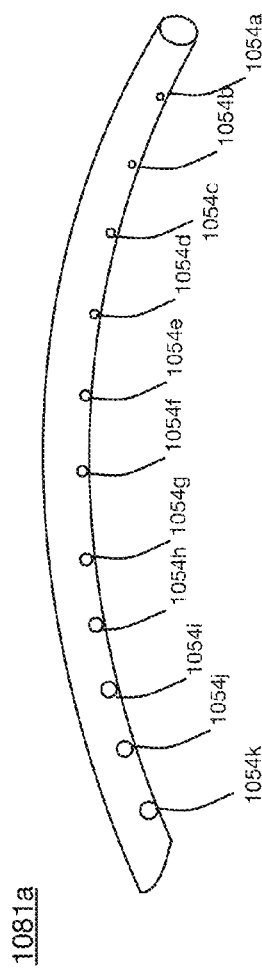
FIG. 10B shows a perspective view of a conduit used in the system of FIG. 10A.

Referring also to FIG. 10B, which shows the curved portion 1081a in more detail, the curved portion 1081a defines openings 1054a-1054k that pass free radicals and gas from an interior of the conduit 1050 toward the element 1020. The openings 1054a-1054k have different sizes, and the sizes increase with increasing distance from the source 1010a.

More or fewer openings can be formed in the curved portion 1081a than are shown in the example of FIG. 10B. The openings can be arranged similarly to one or more of the arrangements of openings shown and described with respect to FIGS. 3A-3B, 5, 6, and 7. For example, a plurality of rows of openings similar to the collection of openings 1054a-1054k can be formed in the portion 1081a. The conduit 1050b has similar openings in the portion 1081b, oriented to direct free radicals toward the element 1020.

Figure 11:
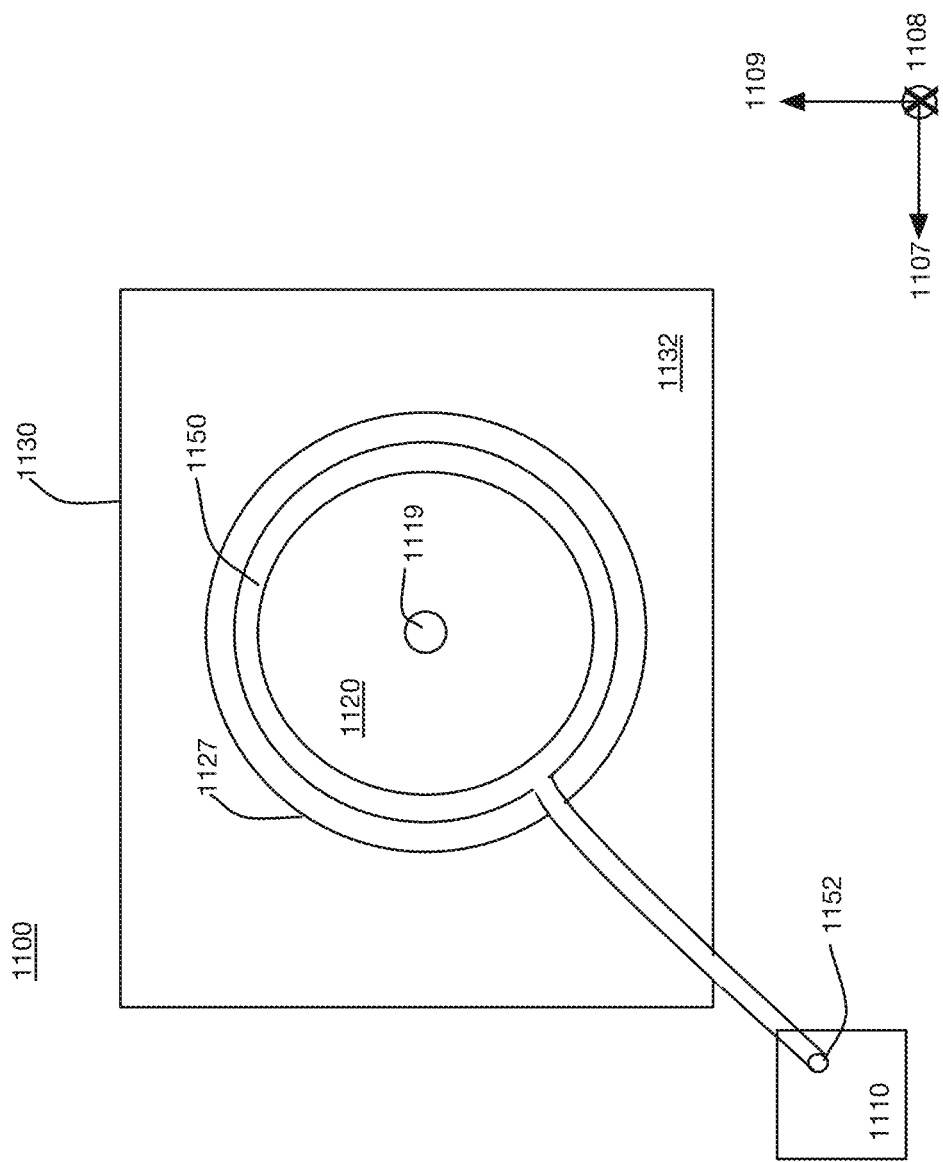
FIG. 11 shows a plan view of another exemplary free radical transport system.

Referring to FIG. 11, another exemplary free radical transport system 1100 is shown. The free radical transport system 1100 includes a conduit 1150 that follows an edge 1127 of an element 1120 to be cleaned. Like the transport system 1000 of FIG. 10A, the transport system 1100 includes a conduit that is out of the optical path of the amplified light beam that is used to generate plasma and/or EUV light that is focused by the element 1120.

The transport system 1100 includes a conduit 1150 that is coupled to a source of free radicals 1110. Like the conduits 1050a, 1050b, the conduit 1150 is made of a material that has a low recombination coefficient and, thus, transports the free radicals generated by the source 1110 to the interior 1132 of a vessel 1130 that holds the element 1120. The conduit 1150 defines openings that pass free radicals toward the element 1120.

Other implementations are within the scope of the following claims.

What is claimed is:

1. A method of cleaning an element in an extreme ultraviolet (EUV) light source, the method comprising:
   arranging a conduit relative to the element, the element being inside of a vacuum chamber of the EUV light source and in the path of EUV light emitted from a plasma and debris created by converting a target material to the plasma that emits the EUV light, the conduit comprising a sidewall that comprises a curved portion and a linear portion, the conduit being arranged with the linear portion passing through a wall of the vacuum chamber and the curved portion inside the vacuum chamber;
   receiving, at a first opening defined by a first end of the conduit, a moving gas and free radicals, the moving gas configured to carry the free radicals in the conduit, and the free radicals being configured to combine with the debris that is created by converting the target material to plasma that emits EUV light, the conduit comprising a metallic material, an inner surface of the conduit being coated with a material having a recombination coefficient of $5\times10^{-3}$ or less, and the conduit defining a plurality of other openings, the other openings passing through the curved portion of the sidewall and positioned to release the free radicals toward an element that accumulates the debris on a surface;
   directing the moving gas to carry the free radicals in the conduit toward the plurality of other openings, the moving gas having a velocity and generating a back pressure in the conduit, the back pressure and the velocity being in different directions;
   reducing an amount of time that the free radicals spend in the conduit by increasing the velocity of the moving gas, the increased velocity of the moving gas changing the back pressure in the conduit; and
   passing the free radicals through at least one of the plurality of other openings and to the surface of the element to remove the debris from the surface of the element without removing the element from the EUV light source.

2. The method of claim 1, wherein the free radicals remove the debris from the surface of the element by etching.

3. The method of claim 1, wherein the plurality of other openings comprise openings of different sizes, each passing through the sidewall, and passing the free radicals through the at least one other opening comprises passing the free radicals through the plurality of openings.

4. The method of claim 3, wherein the smallest of the plurality of openings passing through the sidewall is the opening that is closest to the first opening, and the largest of the plurality of the openings passing through the sidewall is the opening that is farthest from the first opening.

5. The method of claim 4, wherein the sizes of the plurality of openings increase between the smallest of the plurality of openings and the largest of the plurality of openings.

6. The method of claim 1, wherein the debris is removed from the surface of the element at a uniform rate.

7. The method of claim 1, further comprising positioning the at least one other opening defined by the conduit relative to the element.

8. The method of claim 7, wherein positioning the at least one other opening defined by the conduit relative to the element comprises moving the at least one other opening relative to the element.

9. The method of claim 7, wherein the at least one other opening is moved in a plane that is parallel to a perimeter of the element.

10. The method of claim 7, wherein the at least one other opening is rotated relative to a plane that includes a perimeter of the element.

11. The method of claim 1, wherein directing the free radicals in the conduit toward the at least one other opening comprises creating a pressure differential between a source of the free radicals and the plurality of other openings, with the at least one other opening being at a lower pressure than the source of the free radicals and at a higher pressure than a region outside of the conduit.

12. The method of claim 1, wherein the free radicals pass through the at least one other opening while the EUV light source is operating.

13. The method of claim 1, wherein the at least one other opening is in the curved portion of the conduit.

14. A system comprising:
   an extreme ultraviolet light source comprising:
      a vacuum chamber;
      a target material delivery system that directs target material toward a target location in the vacuum chamber, the target location receiving an amplified light beam, and the target material comprising a material that emits extreme ultraviolet light in a plasma state; and
      a collector that receives and reflects at least some of the emitted extreme ultraviolet light;
   a radical transport system comprising:
      a conduit comprising a first opening at a first end of the conduit, a sidewall that defines an inner surface and an outer surface, and a plurality of other openings that pass through the sidewall from the inner surface to the outer surface, the first opening and the inner surface of the conduit comprising a material having a recombination coefficient of $5\times10^{-3}$ or less, the recombination coefficient being a measure of the likelihood of a free radical recombining or otherwise attaching to the material, the sidewall of the conduit passing through a wall of the vacuum chamber and positioned with the first opening external to the vacuum chamber and the plurality of openings inside the vacuum chamber and oriented toward the collector, wherein
      the outer surface of the conduit comprises a relative amount of open regions formed by the plurality of other openings as compared to an amount of the sidewall, and the relative amount of the open regions as compared to the amount of the sidewall increases along the conduit,
      the sidewall of the conduit has an extent of at least 0.8 meters,
      the sidewall of the conduit comprises a linear portion and a curved portion,
      at least one of the plurality of openings is in the curved portion of the conduit,
      the conduit comprises a metallic material, and
      the metallic material of the conduit is coated with the material that has a recombination coefficient of $5\times10^{-3}$ or less at the inner surface and the first opening; and a source of free radicals comprising an applicator configured to generate free radicals from microwave energy, the source of free radicals being external to the vacuum chamber, and the applicator of the source of free radicals being coupled to the conduit at the first opening.

15. The system of claim 14, wherein the relative amount of the open regions as compared to the amount of the sidewall increases along the conduit comprises the openings having different sizes, the smallest of the plurality of openings being closest to the first end of the conduit, and the largest of the plurality of openings being farthest from the first end of the conduit.

16. The system of claim 14, wherein the conduit is positioned outside of a path of propagation of the amplified light beam.

17. The system of claim 14, wherein the conduit is configured to move relative to the collector.

18. The system of claim 14, wherein the radical transport system comprises a plurality of conduits.

19. The system of claim 14, wherein the perimeter of the collector is curved, and the curved portion of the conduit follows the curved perimeter of the collector.

20. The system of claim 19, wherein the collector comprises an aperture through which the amplified light beam propagates, and the curved portion of the collector is between the aperture of the collector and the perimeter of the collector.

21. The system of claim 20, wherein the curved portion of the conduit is in a plane that does not coincide with any portion of the collector.

22. The system of claim 19, wherein the curved portion of the conduit is a single-piece loop.

23. The system of claim 20, wherein a hollow shroud extends from the aperture of the collector toward the target location, the hollow shroud configured to direct gas toward the target location.

24. The system of claim 23, wherein the hollow shroud is configured to direct gas toward the target location through the aperture of the collector.

25. The system of claim 14, wherein the conduit is entirely out of a path of EUV light received and reflected by the collector.

26. The system of claim 14, wherein the material that has a recombination coefficient of $5\times10^{-3}$ or less comprises a non-metallic material.

27. The system of claim 26, wherein the non-metallic material comprises quartz.

28. The system of claim 14, wherein the metallic material of the conduit comprises one of an oxidized metal and an anodized metal.

29. The system of claim 14, wherein the metallic material of the conduit comprises one or more of aluminum, silicon dioxide, titanium oxide, and aluminum oxide.

30. A system comprising:
an extreme ultraviolet light source comprising:
a vacuum chamber;
a target material delivery system that directs target material toward a target location in the vacuum chamber, the target location receiving an amplified light beam, and the target material comprising a material that emits extreme ultraviolet (EUV) light in a plasma state; and
a collector inside the vacuum chamber and in the path of the emitted EUV light and debris generated by the conversion of the target material to plasma, the collector positioned to receive and reflect at least some of the emitted EUV light, and to receive at least some of the debris; and
a radical transport system comprising:
a conduit comprising a first opening at a first end of the conduit, a sidewall that defines an inner surface, an outer surface, and a plurality of other openings that pass from the inner surface to the outer surface, the first opening and the inner surface of the conduit comprising a non-metallic material that has a recombination coefficient of $5\times10^{-3}$ or less, the recombination coefficient being a measure of the likelihood of a free radical recombining or otherwise attaching to the material, the sidewall of the conduit passing through a wall of the vacuum chamber and configured to direct the free radicals to the collector to remove the debris from the collector without removing the collector from the vacuum chamber, wherein the outer surface of the conduit comprises a relative amount of open regions formed by the plurality of other openings as compared to an amount of the sidewall, and the relative amount of the open regions as compared to the amount of the sidewall increases along the conduit,
the conduit is positioned in a plane that is different from a plane that includes any portion of the collector,
the conduit comprises a metallic material, and
the metallic material of the conduit is coated with the non-metallic material that has a recombination coefficient of $5\times10^{-3}$ or less at the inner surface, the first opening, and the plurality of other openings.

31. The system of claim 30, wherein the sidewall of the conduit has a longitudinal extent of at least 0.8 meters.

32. The system of claim 30, wherein the conduit is configured to direct the free radicals to the collector at a constant rate.

33. The system of claim 30, wherein the conduit is configured to move relative to the collector.

34. The system of claim 30, wherein the conduit is configured to move relative to the collector while free radicals pass through the at least one other opening.

35. The system of claim 34, wherein the conduit is configured to rotate relative to the collector, and the at least one other opening rotates relative to the collector when the conduit rotates relative to the collector.

36. The system of claim 34, wherein the conduit is configured to move laterally relative to the collector in the plane in which the conduit is positioned, and the at least one other opening moves relative to the collector in the plane in which the conduit is positioned when the conduit moves laterally relative to the collector.

37. The system of claim 30, wherein the target material and the debris comprise tin, and the radical transport system comprises at least one source of hydrogen radicals, one of the sources of hydrogen radicals being coupled to one of the at least one conduits.

38. The system of claim 30, wherein the conduit is entirely out of a path of EUV light received and reflected by the collector.

39. The system of claim 30, wherein the non-metallic material that has a recombination coefficient of $5\times10^{-3}$ or less comprises quartz.

40. The system of claim 30, wherein the non-metallic material that has a recombination coefficient of $5\times10^{-3}$ or less comprises one of Teflon, glass, and borosilicate glass.

41. The system of claim 30, wherein the metallic material of the conduit comprises one of an oxidized metal and an anodized metal.

42. The system of claim 30, wherein the metallic material of the conduit comprises one or more of aluminum, silicon dioxide, titanium oxide, and aluminum oxide.

43. A radical transport system for an extreme ultraviolet (EUV) light source, the radical transport system comprising:
  a first conduit and a second conduit, each of the first and second conduits comprising:
   a linear portion comprising a first end and a sidewall that extends from the first end to a second end, the first end comprising an opening and configured to connect to one of a first source and a second source of free radicals to receive free radicals from the one of the first source or the second source of free radicals through the opening, the sidewall configured to pass through a wall of a vacuum chamber of an extreme ultraviolet light (EUV) source with the first end and the opening being exterior to the vacuum chamber; and
   a curved portion in fluid communication with the linear portion, the curved portion comprising a curved sidewall that extends from the second end of the linear portion, the curved sidewall comprising a plurality of other openings configured to pass free radicals from an interior of the curved portion of the conduit to an exterior of the curved portion of the conduit, and the curved sidewall configured to follow a curved perimeter of an optical element inside of the vacuum chamber of the EUV light source, wherein
  the exterior of the curved portion comprises a relative amount of open regions formed by the plurality of other openings as compared to an amount of the sidewall, and the relative amount of the open regions as compared to the amount of the sidewall increases with distance from the source,
  the linear portion and the curved portion comprise a non-metallic material that has a recombination coefficient of $5 \times 10^{-3}$ or less, the recombination coefficient being a measure of the likelihood of a free radical recombining or otherwise attaching to the material, and
  at least one of the first and second conduits comprises a metallic material, the metallic material being coated with the non-metallic material that has a recombination coefficient of $5 \times 10^{-3}$ or less.

44. The transport system of claim 43, further comprising:
the first source of free radicals; and
the second source of free radicals.

* * * * *